(12) United States Patent
Kwon

(10) Patent No.: US 12,575,272 B2
(45) Date of Patent: Mar. 10, 2026

(54) DISPLAY DEVICE WITH FUNCTIONAL FILM LAYER IN CONTACT WITH LIGHT SHIELDING LAYER

(71) Applicant: LG DISPLAY CO., LTD., Seoul (KR)

(72) Inventor: Hoiyong Kwon, Seoul (KR)

(73) Assignee: LG Display Co., Ltd (KR)

( * ) Notice: Subject to any disclaimer, the term of this patent is extended or adjusted under 35 U.S.C. 154(b) by 808 days.

(21) Appl. No.: 17/899,656

(22) Filed: Aug. 31, 2022

(65) Prior Publication Data

US 2023/0074232 A1 Mar. 9, 2023

(30) Foreign Application Priority Data

Sep. 3, 2021 (KR) ......................... 10-2021-0117767

(51) Int. Cl.
*H10K 59/131* (2023.01)
(52) U.S. Cl.
CPC ................................. *H10K 59/131* (2023.02)
(58) Field of Classification Search
CPC .................................................... H10K 59/131
See application file for complete search history.

(56) References Cited

U.S. PATENT DOCUMENTS

| | | | | |
|---|---|---|---|---|
| 2002/0118325 A1* | 8/2002 | Hinata | .............. | G02F 1/133555 |
| | | | | 349/113 |
| 2015/0206929 A1* | 7/2015 | Sato | ..................... | H10K 59/123 |
| | | | | 257/40 |
| 2015/0378182 A1* | 12/2015 | Shin | .................. | H10K 59/8792 |
| | | | | 252/586 |
| 2015/0379923 A1* | 12/2015 | Lee | ..................... | H10K 59/1315 |
| | | | | 345/82 |
| 2016/0141349 A1* | 5/2016 | Yun | ....................... | H10K 59/126 |
| | | | | 438/23 |
| 2017/0322471 A1* | 11/2017 | Jeong | ................ | G02F 1/136209 |
| 2018/0097047 A1* | 4/2018 | Jung | .................... | H10K 59/124 |
| 2021/0181590 A1* | 6/2021 | Hong | ..................... | H10D 86/60 |
| 2022/0005916 A1* | 1/2022 | Kim | ................ | H10K 59/80518 |
| 2023/0189564 A1* | 6/2023 | Zhang | .................. | H10D 86/441 |
| | | | | 257/71 |

FOREIGN PATENT DOCUMENTS

| | | | | | |
|---|---|---|---|---|---|
| CN | 113224120 A | * | 8/2021 | ......... | H10K 59/1216 |
| KR | 20100076486 A | | 7/2010 | | |
| KR | 10-1296263 B1 | | 8/2013 | | |
| KR | 10-2016-0084549 A | | 7/2016 | | |
| KR | 20170035397 A | | 3/2017 | | |
| KR | 10-2019-0028594 A | | 3/2019 | | |
| KR | 20210064921 A | | 6/2021 | | |

OTHER PUBLICATIONS

Office Action in Korean Appln. No. 10-2021-0117767, mailed on Jul. 4, 2025, 8 pages (with English translation).

* cited by examiner

*Primary Examiner* — Lex H Malsawma

(74) *Attorney, Agent, or Firm* — Fish & Richardson P.C.

(57) ABSTRACT

A display device includes a display area including a plurality of subpixels and a non-display area, the display device comprises a lower substrate formed of a transparent conductive oxide or an oxide semiconductor; a plurality of transistors and a plurality of light emitting devices disposed in the plurality of subpixels on the lower substrate; and a metal layer disposed between the lower substrate and the plurality of transistors, wherein the lower substrate includes a plurality of first patterns overlapping with the metal layer and in contact with the metal layer.

16 Claims, 20 Drawing Sheets

CF(CFR,CFG,CFB)
DL(DL1,DL2,DL3,DL4)
DP(TR1,TR2,TR3,SC)

PTN1~110

CF(CFR,CFG,CFB)
DL(DL1,DL2,DL3,DL4)
DP(TR1,TR2,TR3,SC)

310(PTN1,PTN2,PTN3)

500

PE     530          520

XVIII                                                                                                    XVIII'

DISPLAY DEVICE WITH FUNCTIONAL FILM LAYER IN CONTACT WITH LIGHT SHIELDING LAYER

CROSS-REFERENCE TO RELATED APPLICATION

This application claims the priority of Korean Patent Application No. 10-2021-0117767 filed on Sep. 3, 2021, which is hereby incorporated by reference in its entirety.

BACKGROUND

Field of the Disclosure

The present disclosure relates to a display device, and more particularly, to a display device with improved moisture permeability and reduced parasitic capacitance without using a plastic substrate.

Description of the Background

In display devices which are used for monitors of computers, TVs, mobile phones, or the like, there are an organic light emitting display (OLED) device, and the like that self-emit light, a liquid crystal display (LCD) device, and the like that require a separate light source, etc.

The display devices are diversified in application ranges up to personal mobile devices as well as monitors of computers and TVs, and research on display devices with reduced volume and weight as well as a wide display area has been conducted.

In addition, in recent years, a flexible display device has attracted attention as a next-generation display device, which is manufactured to display an image even when folded or rolled by forming a display element, lines, and the like on a flexible substrate such as plastic, which is a flexible material.

SUMMARY

Accordingly, the present disclosure is to provide a display device having a very thin substrate by using one of a transparent conductive oxide layer and an oxide semiconductor layer instead of a plastic substrate.

The present disclosure is also to provide a display device capable of minimizing permeation of moisture and oxygen.

The present disclosure is also to provide a display device capable of simplifying a process and reducing manufacturing costs by removing a plastic substrate.

Further, the present disclosure is to provide a display device capable of minimizing parasitic capacitance generated by using a transparent conductive oxide layer as a substrate.

According to the present disclosure, moisture permeability can be easily controlled by using the transparent conductive oxide layer and the oxide semiconductor layer as the substrate of the display device.

The present disclosure is not limited to the above-mentioned and other features, which are not mentioned above, can be clearly understood by those skilled in the art from the following descriptions.

According to an aspect of the present disclosure, a display device includes a display area including a plurality of subpixels and a non-display area, the display device comprises a lower substrate formed of a transparent conductive oxide or an oxide semiconductor; a plurality of transistors and a plurality of light emitting devices disposed in the plurality of subpixels on the lower substrate; and a metal layer disposed between the lower substrate and the plurality of transistors, wherein the lower substrate includes a plurality of first patterns overlapping with the metal layer and in contact with the metal layer.

According to another aspect of the present disclosure, the display device further comprises a signal line disposed in the display area and made of the same material as the light shielding layer, wherein the functional thin film layer further includes a plurality of second patterns that has a shape corresponding to the signal line and is in contact with a lower surface of the signal line.

Other detailed matters of the exemplary aspects are included in the detailed description and the drawings.

According to the present disclosure, flexibility of a display device can be improved by using the transparent conductive oxide layer and the oxide semiconductor layer as the substrate of the display device.

According to the present disclosure, stress generated when a display device is bent or rolled and reduce cracks of the display device can be relieved by using the transparent conductive oxide layer and the oxide semiconductor layer as the substrate of the display device.

According to the present disclosure, the structure of the display device can be simplified and manufacturing costs can be reduced by using the transparent conductive oxide layer and the oxide semiconductor layer as the substrate of the display device.

According to the present disclosure, generation of static electricity in the substrate can be reduced and display quality can be improved by using the transparent conductive oxide layer and the oxide semiconductor layer as the substrate of the display device.

According to the present disclosure, the substrate manufacturing time can be reduced and the formation of foreign materials on the substrate and defects resulting therefrom can be minimized by manufacturing the substrate of the display device in a deposition process in a vacuum environment.

According to the present disclosure, parasitic capacitance compared to a case of using a transparent conductive oxide layer can be suppressed as the front surface by forming patterns on the substrate of the display device using the transparent conductive oxide layer and the oxide semiconductor layer.

According to the present disclosure, a robust structure can be obtained and cracks in an area where the link lines are disposed can be suppressed by disposing the upper substrate to overlap with a plurality of pads.

The effects according to the present disclosure are not limited to the contents exemplified above, and more various effects are included in the present specification.

BRIEF DESCRIPTION OF THE DRAWINGS

The above and other aspects, features, and other advantages of the present disclosure will be more clearly understood from the following detailed description taken in conjunction with the accompanying drawings, in which.

3

Figure 3:
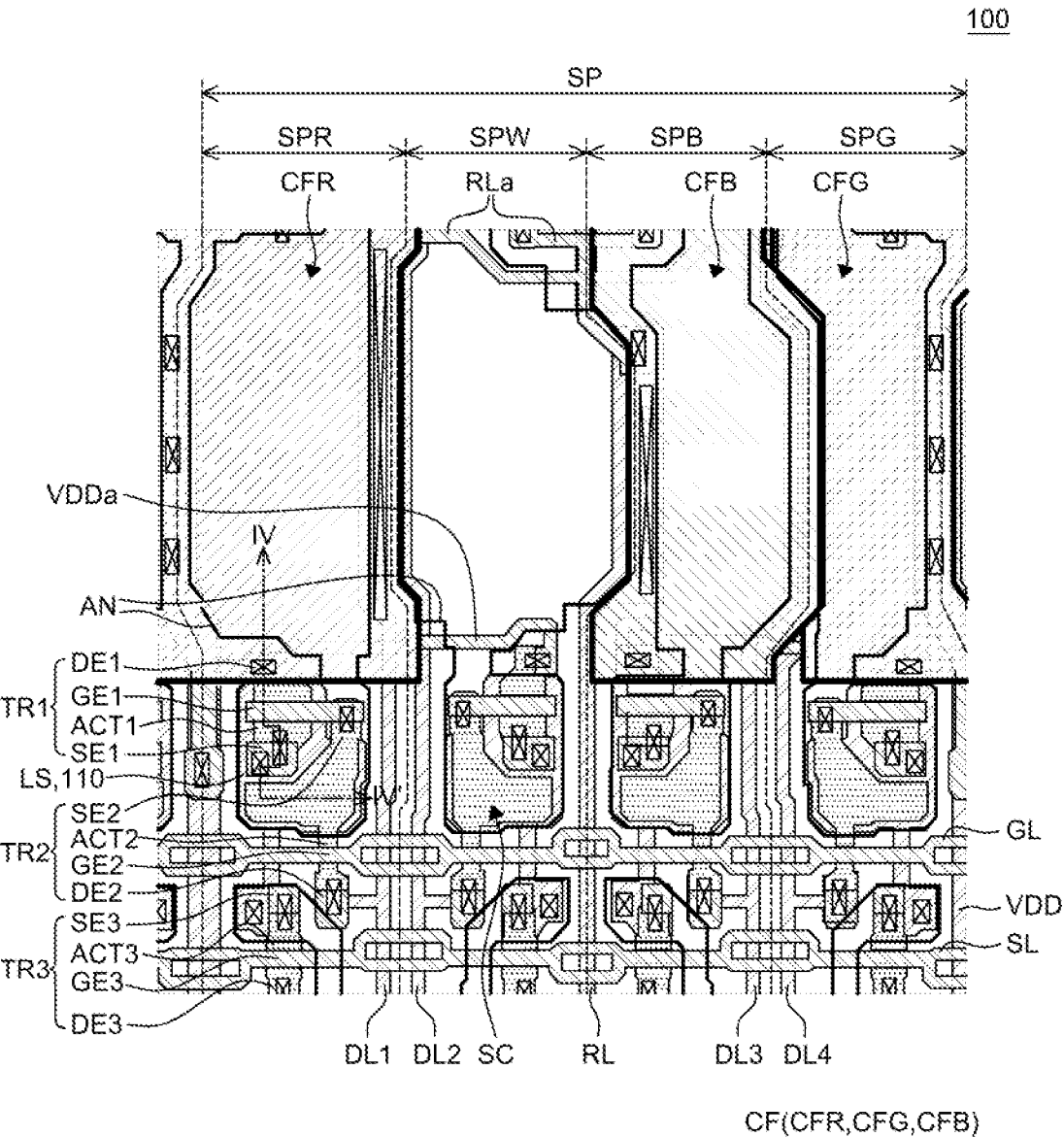
FIG. 3 is an enlarged plan view of the display device according to the exemplary aspect of the present disclosure.
Figure 4:
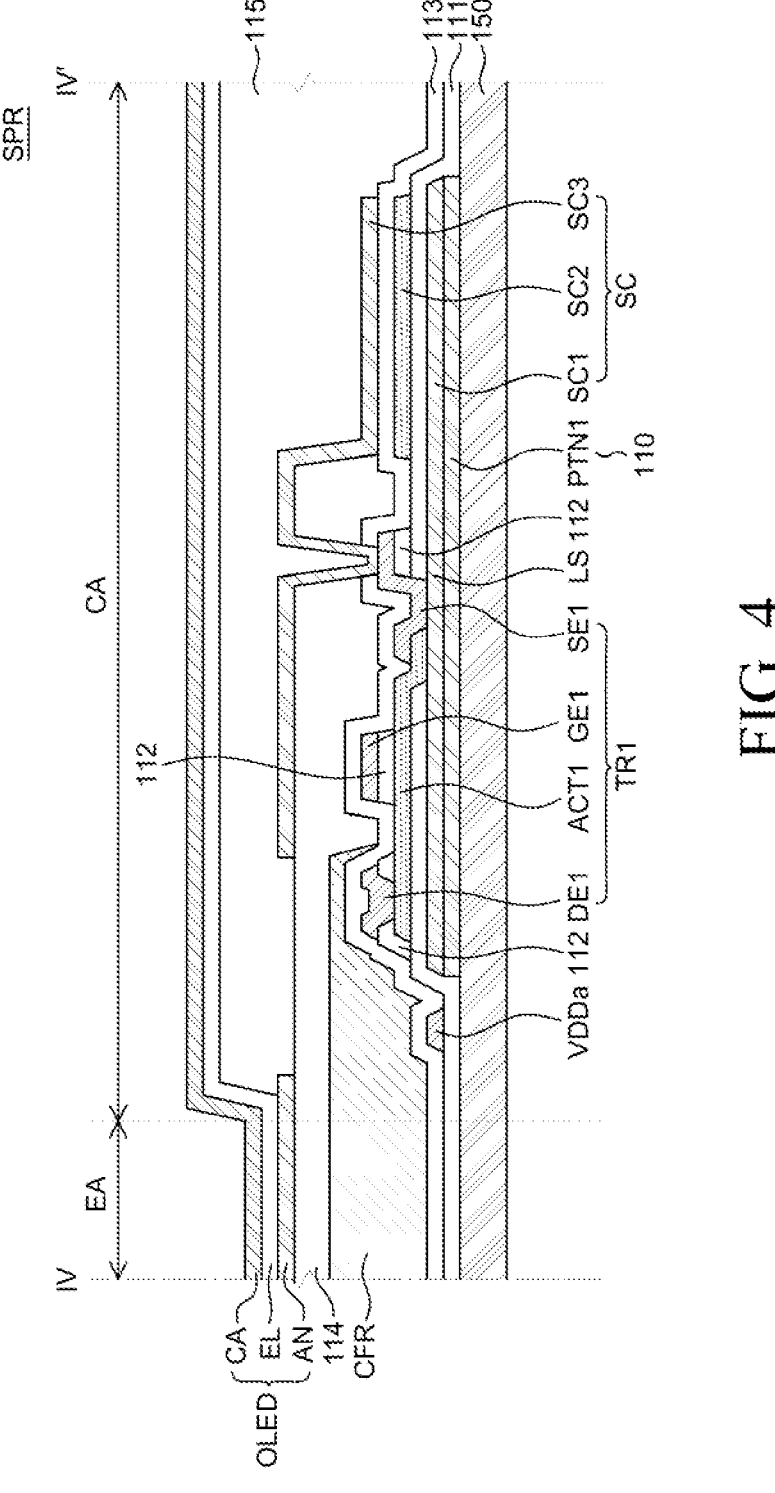
Figure 5:
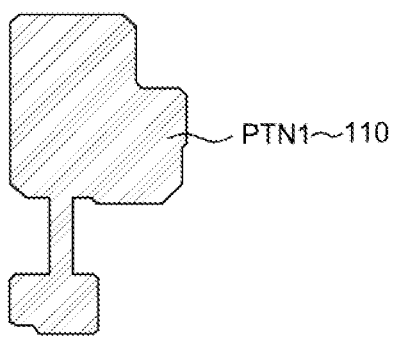
Figure 6:
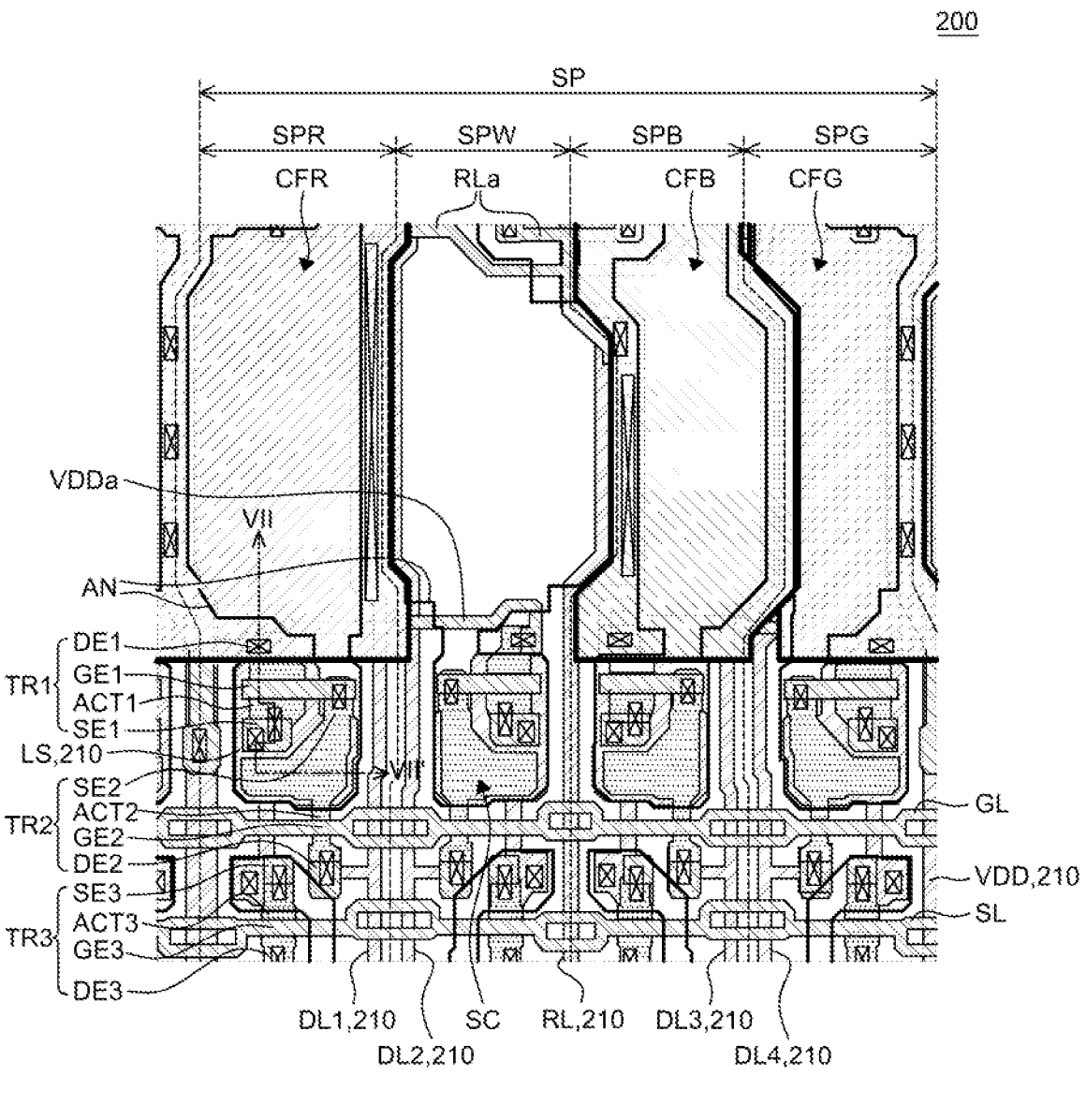
Figure 7:
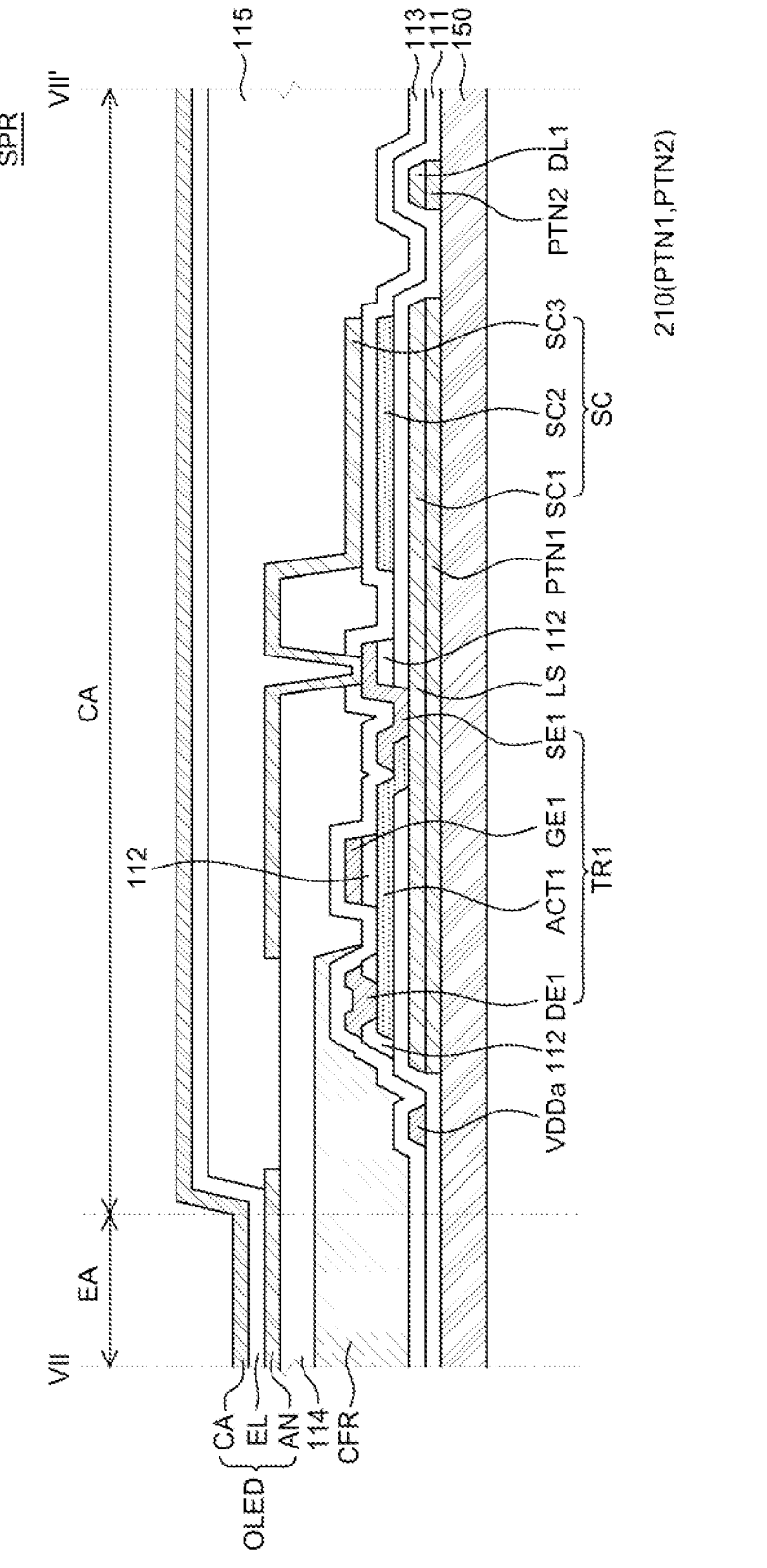
Figure 8:
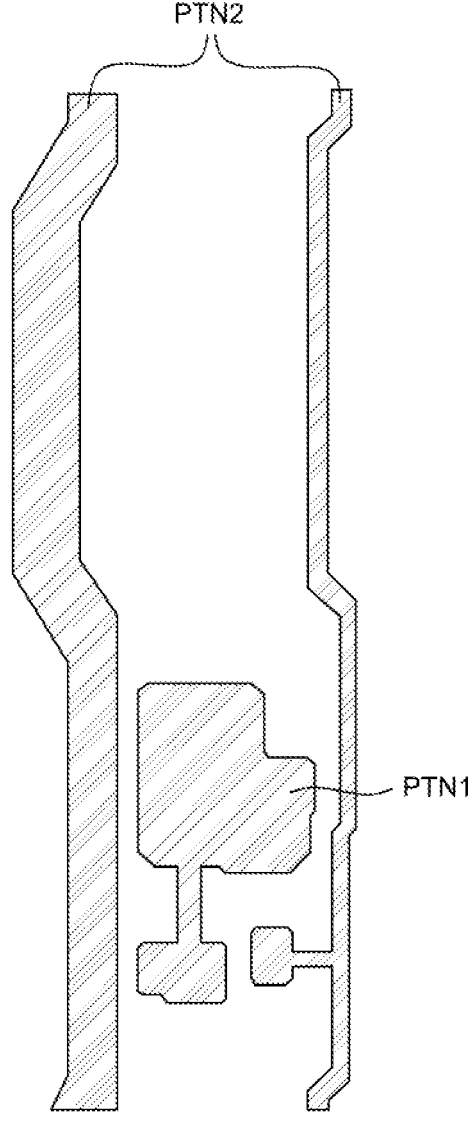
Figure 9:
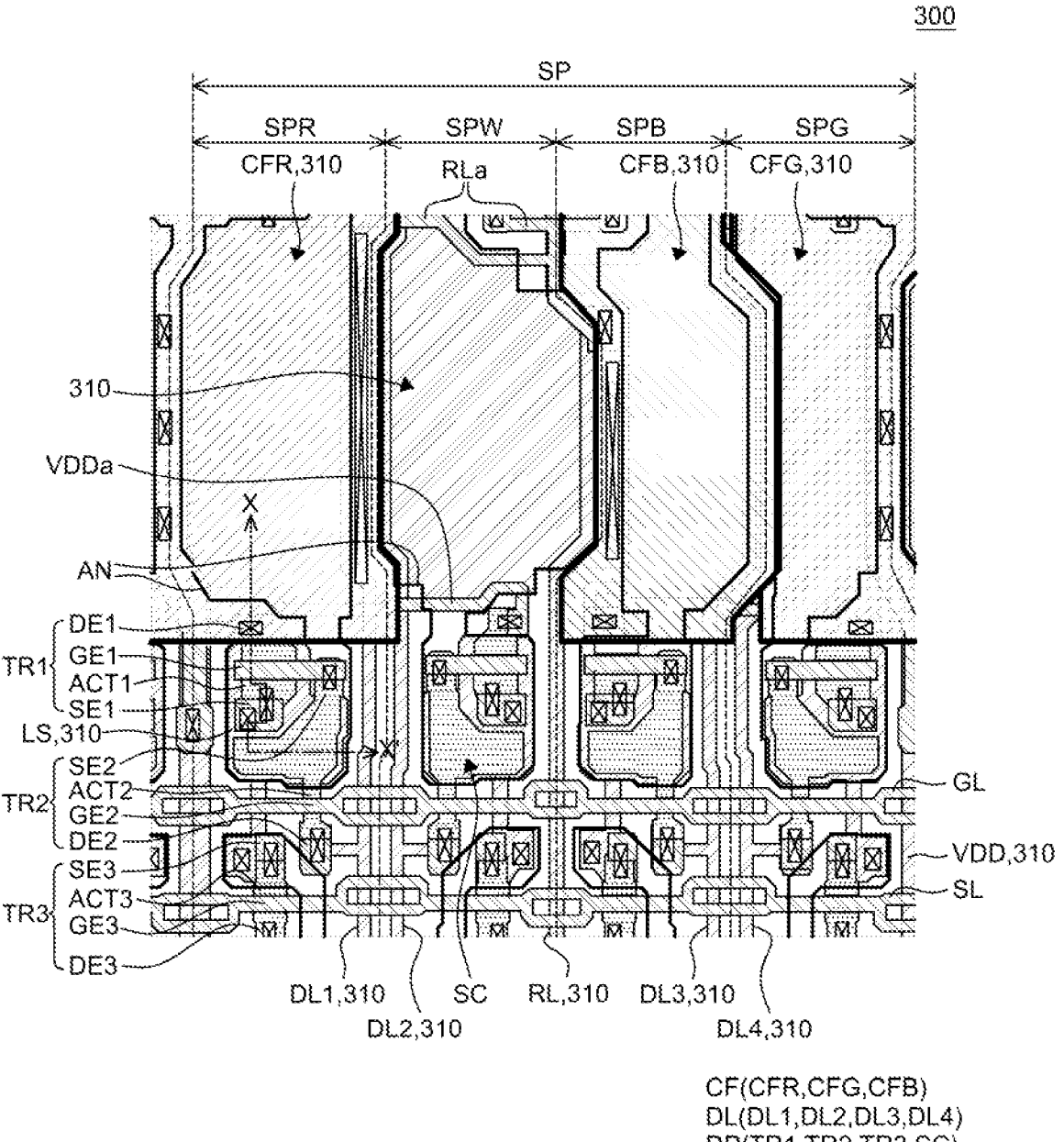
Figure 10:
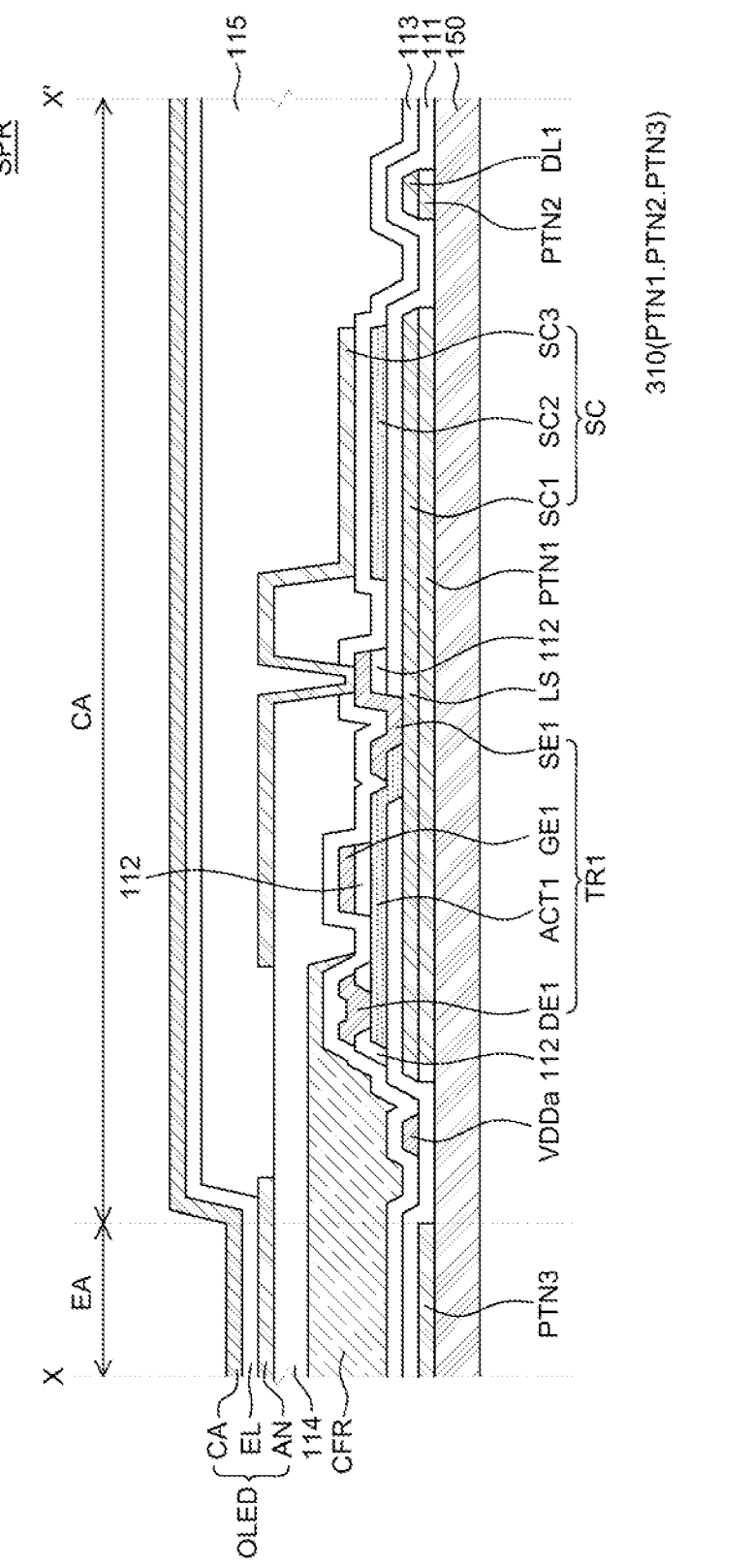
Figure 11:
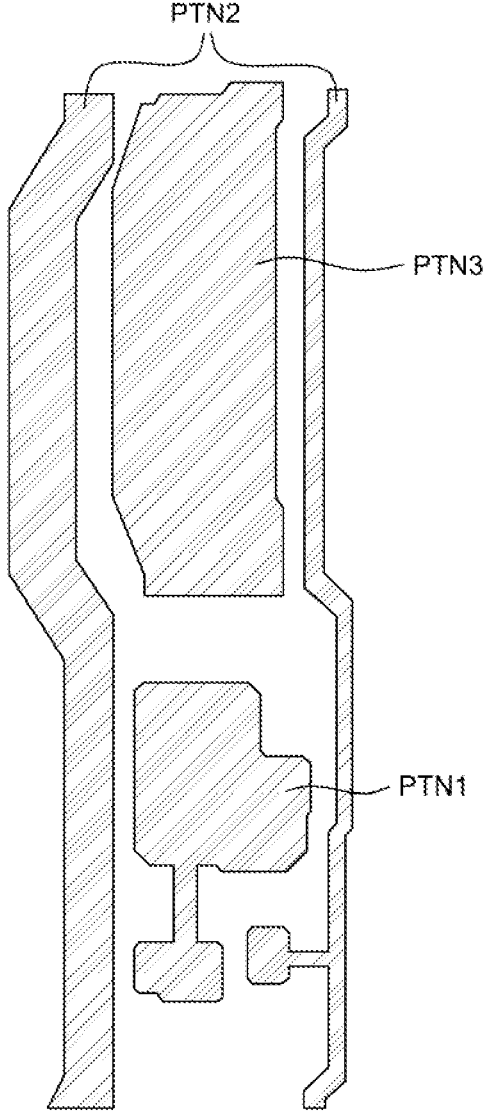
Figure 12:
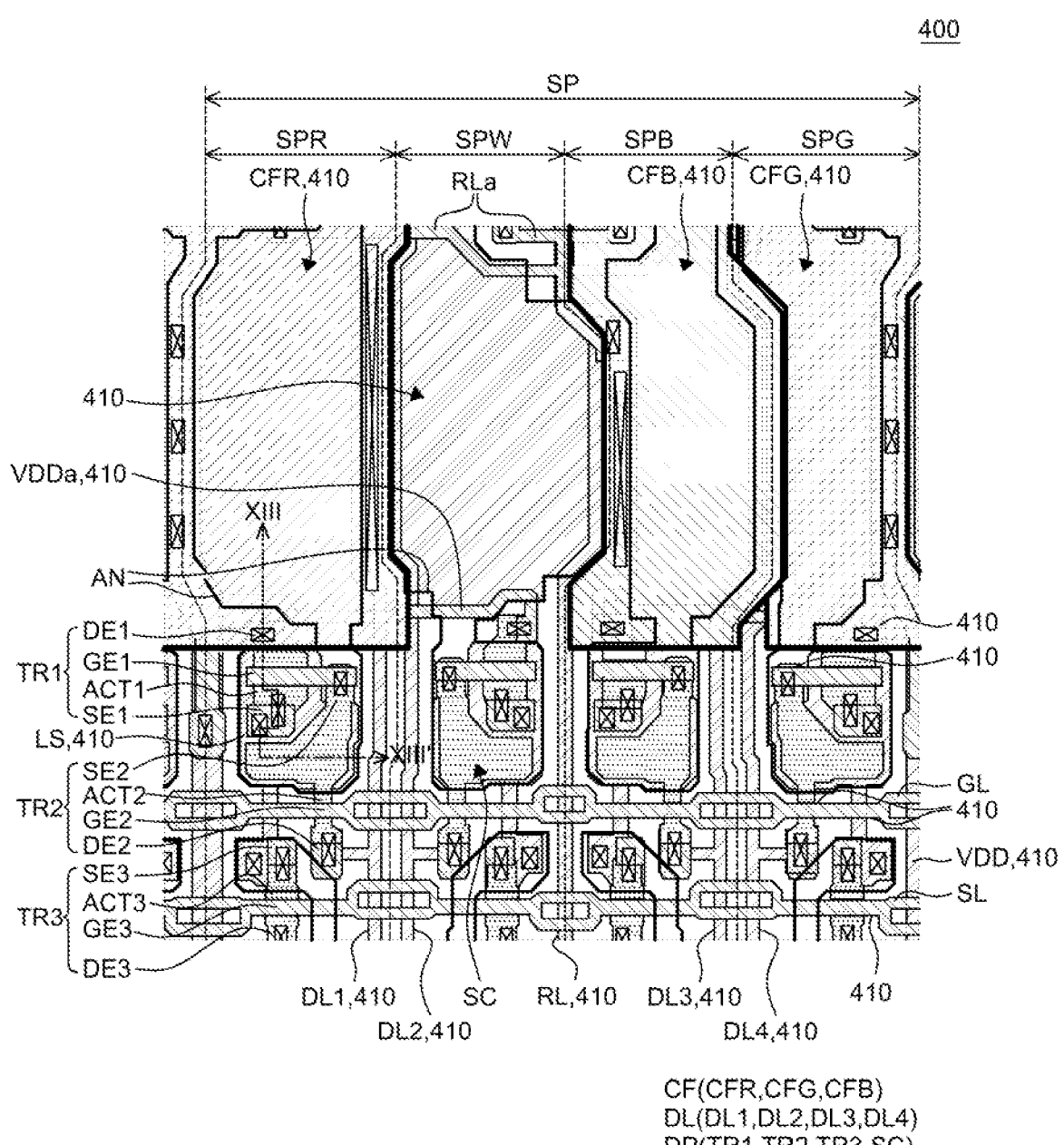
Figure 13:
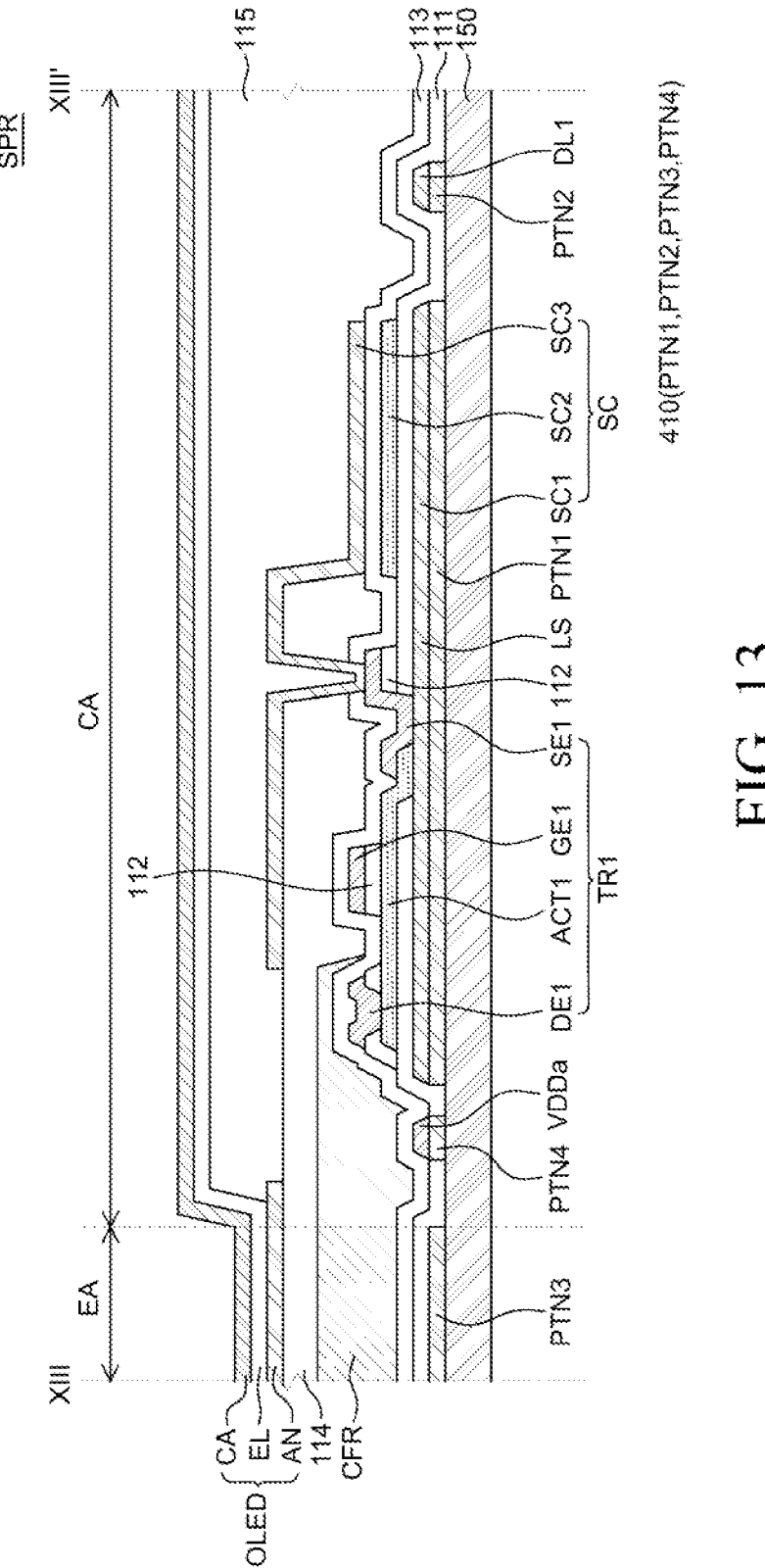
Figure 14:
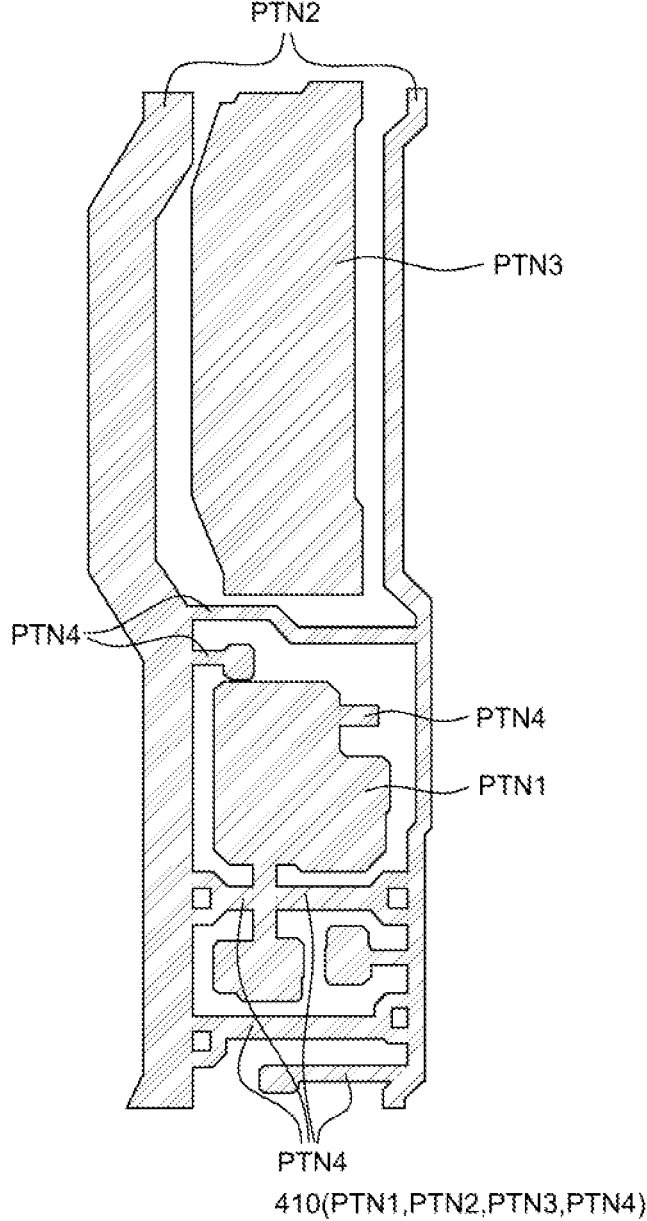
Figure 15:
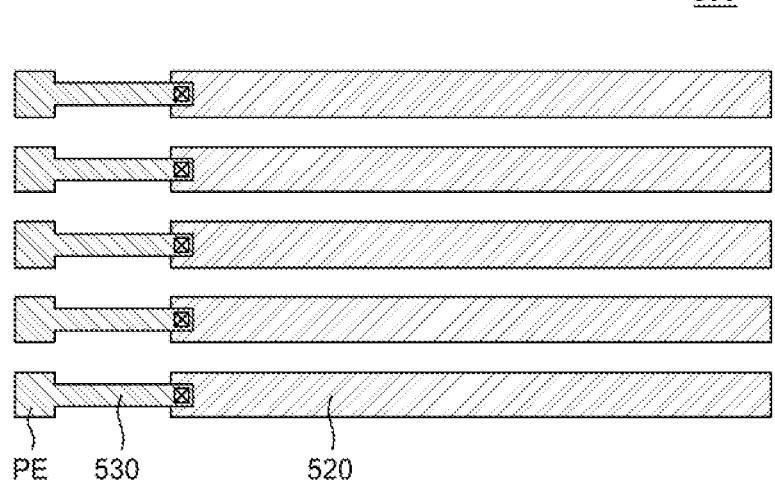
Figure 16:
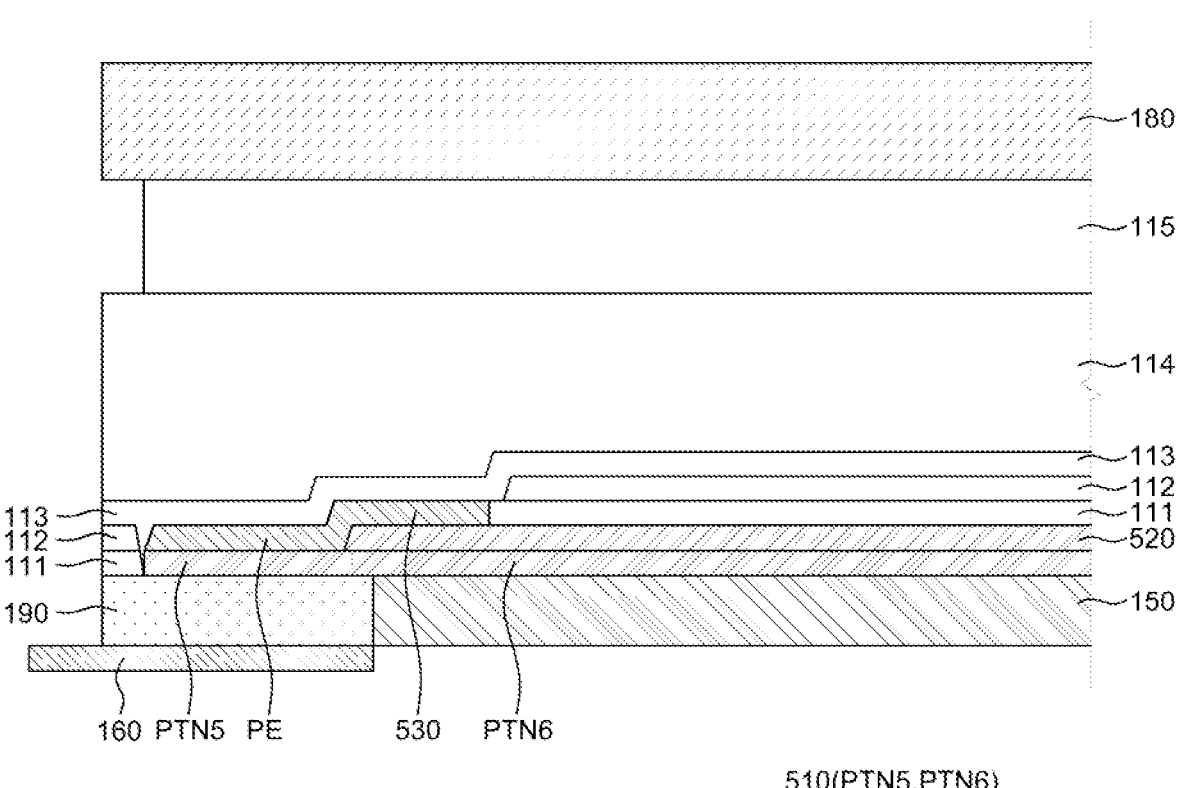
Figure 17A:
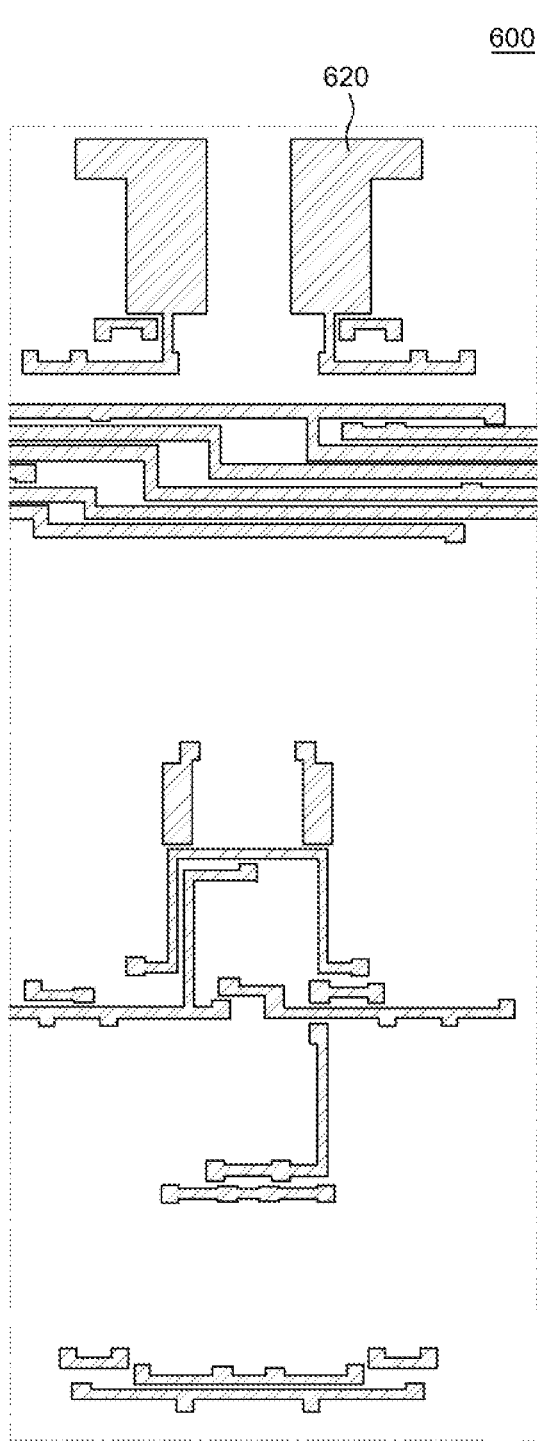
Figure 17B:
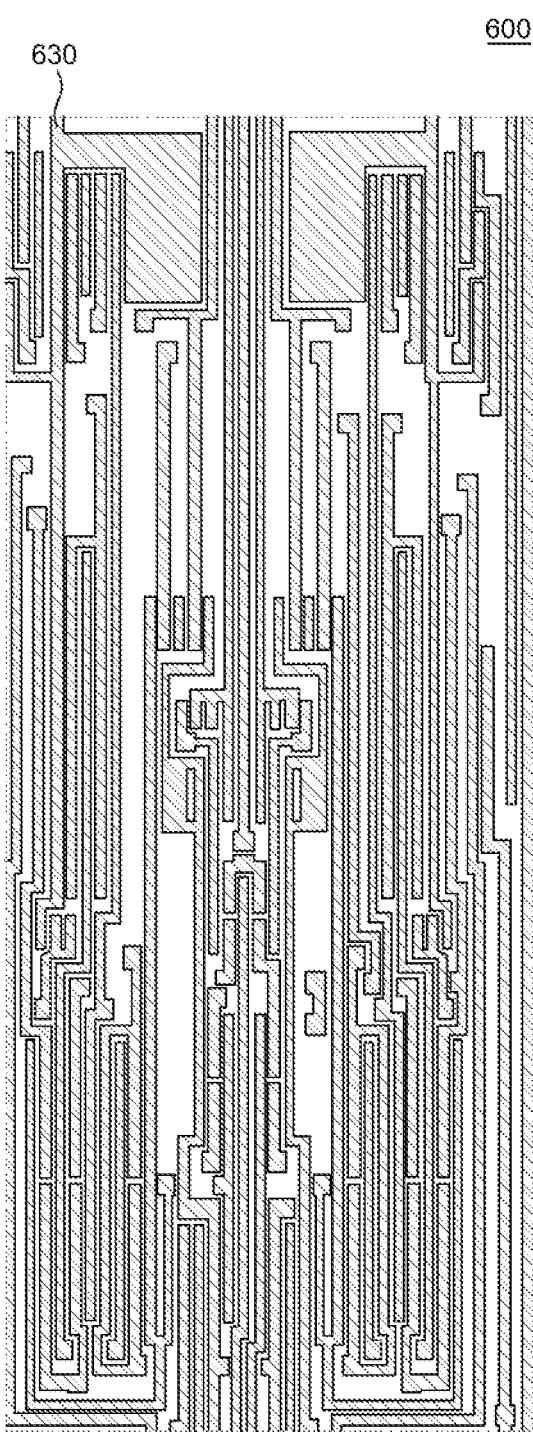
Figure 17C:
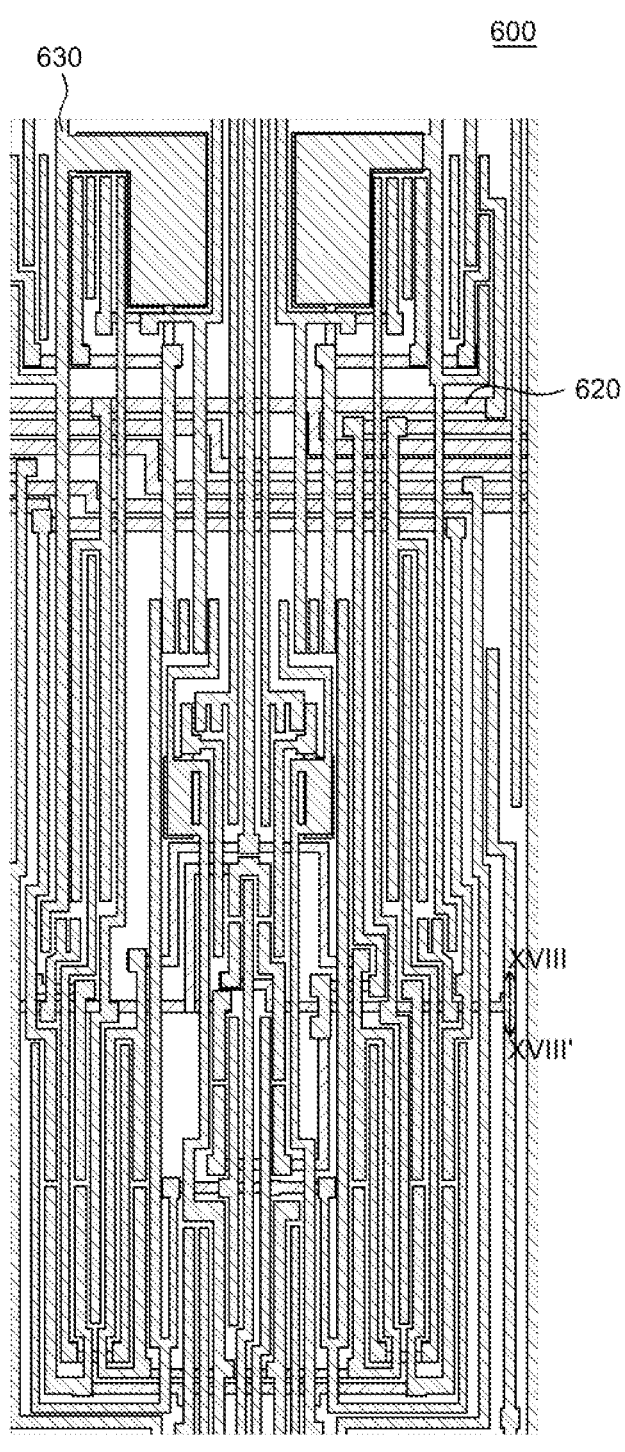
Figure 18:
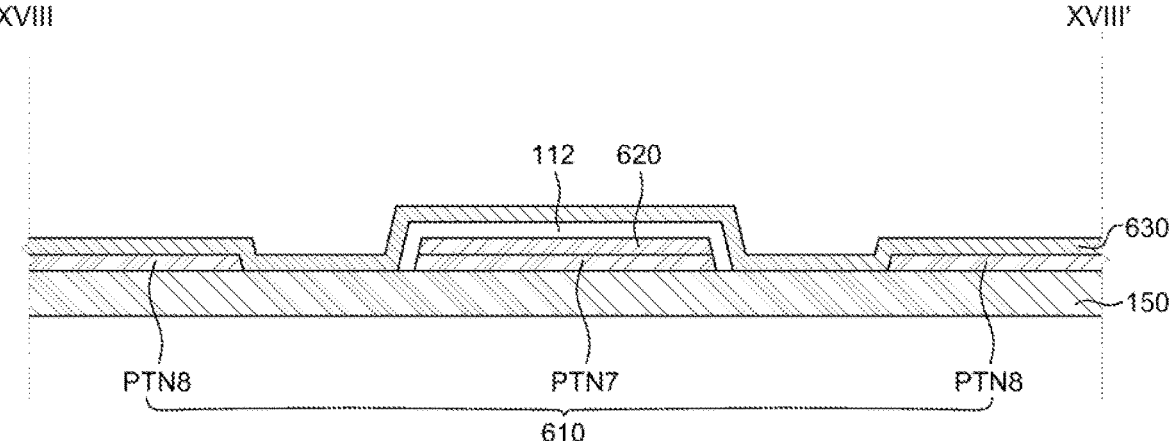

FIG. 4 is a cross-sectional view taken along line IV-IV' of FIG. 3;

FIG. 5 is an enlarged plan view of a lower substrate of a red subpixel of FIG. 3;

FIG. 6 is an enlarged plan view of a display device according to another exemplary aspect of the present disclosure;

FIG. 7 is a cross-sectional view taken along line VII-VII' of FIG. 6;

FIG. 8 is an enlarged plan view of a lower substrate of a red subpixel of FIG. 6;

FIG. 9 is an enlarged plan view of a display device according to yet another exemplary aspect of the present disclosure;

FIG. 10 is a cross-sectional view taken along line X-X' of FIG. 9;

FIG. 11 is an enlarged plan view of a lower substrate of a red subpixel of FIG. 9;

FIG. 12 is an enlarged plan view of a display device according to yet another exemplary aspect of the present disclosure;

FIG. 13 is a cross-sectional view taken along line XIII-XIII' of FIG. 12;

FIG. 14 is an enlarged plan view of a lower substrate of a red subpixel of FIG. 12;

FIG. 15 is a plan view of a pad and a link line of a display device according to another exemplary aspect of the present disclosure;

FIG. 16 is a schematic cross-sectional view of a display device according to yet another exemplary aspect of the present disclosure;

FIGS. 17A to 17C are plan views of a gate driver of the display device according to yet another exemplary aspect of the present disclosure; and FIG. 18 is a cross-sectional view taken along line XVIII-XVIII' of FIG. 17C.

DETAILED DESCRIPTION

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, exemplary aspects of the present disclosure will be described in detail with reference to accompanying drawings.

Figure 1:
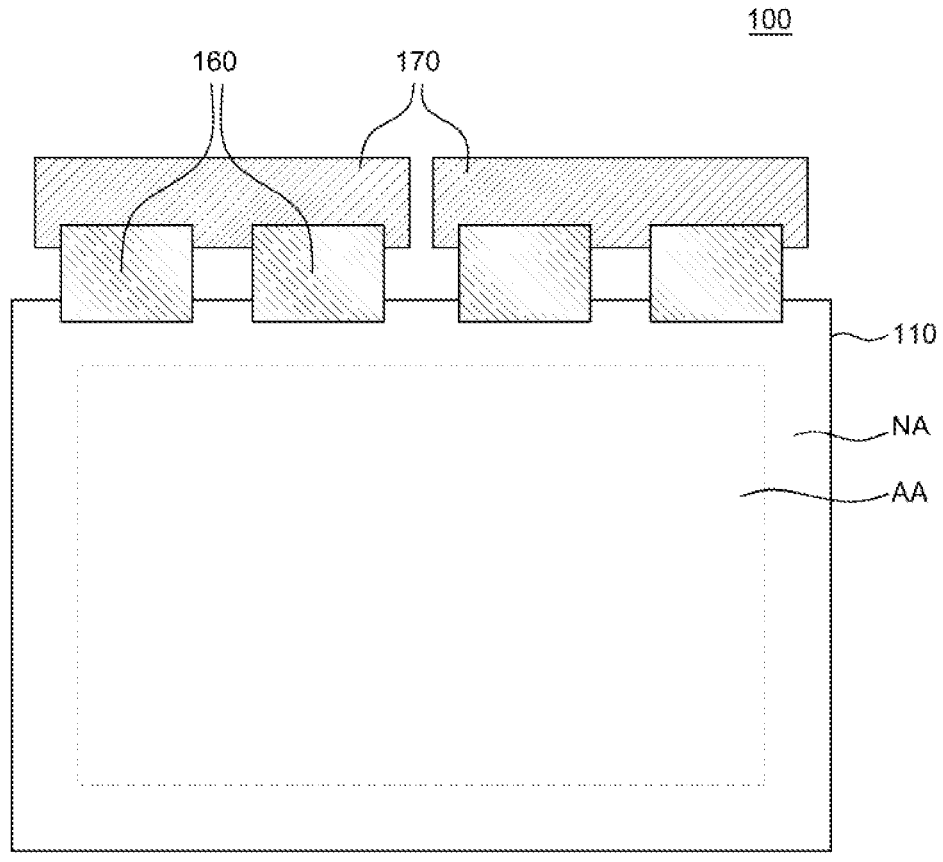
FIG. 1 is a plan view of a display device according to an exemplary aspect of the present disclosure.

FIG. 1 is a plan view of a display device according to an exemplary aspect of the present disclosure. In FIG. 1, for convenience of description, among various components of a display device 100, a lower substrate 110, a plurality of flexible films 160, and a plurality of printed circuit boards 170 are just illustrated.

Referring to FIG. 1, the lower substrate 110 is a support member for supporting other components of the display device 100. Although the lower substrate 110 is illustrated as having a single pattern in FIG. 1, this is for convenience of description, and the lower substrate 110 has a plurality of patterns. That is, the plurality of patterns spaced apart from each other may be disposed to support other components of the display device 100. A more detailed description of the plurality of patterns will be described in detail with reference to FIGS. 3 and 4.

The lower substrate 110 may be formed of any one of a transparent conductive oxide and an oxide semiconductor. For example, the lower substrate 110 may be formed of a transparent conductive oxide (TCO), such as indium tin oxide (ITO), indium zinc oxide (IZO), or indium tin zinc oxide (ITZO).

In addition, the lower substrate 110 may be formed of an oxide semiconductor material made of indium (In) and gallium (Ga), for example, a transparent oxide semiconductor, such as indium gallium zinc oxide (IGZO), indium gallium oxide (IGO), and indium tin zinc oxide (ITZO). However, the material types of the transparent conductive oxide and the oxide semiconductor are exemplary, and the first substrate 110 may be formed of other transparent conductive oxides and oxide semiconductor materials which are not illustrated in the present disclosure, but are not limited thereto.

Meanwhile, the lower substrate 110 may be formed by depositing a transparent conductive oxide or an oxide semiconductor with a very thin thickness. Accordingly, the lower substrate 110 may be formed with a very thin thickness to have flexibility. In addition, the display device 100 including the lower substrate 110 having flexibility may be implemented as a flexible display device 100 capable of displaying an image even when folded or rolled. For example, when the display device 100 is a foldable display device, the lower substrate 110 may be folded or unfolded about a folding axis. As another example, when the display device 100 is a rollable display device, the display device may be rolled and stored on a roller. Accordingly, the display device 100 according to the exemplary aspect of the present disclosure may be implemented as a flexible display device 100 such as a foldable display device or a rollable display device using the lower substrate 110 having flexibility.

In addition, the display device 100 according to the exemplary aspect of the present disclosure may perform a laser lift off (LLO) process using the lower substrate 110 formed of a transparent conductive oxide or an oxide semiconductor. The LLO process refers to a process of separating a temporary substrate under the lower substrate 110 and the lower substrate 110 using a laser during the manufacturing process of the display device 100. Accordingly, since the lower substrate 110 is a layer for an easier LLO process, the lower substrate 110 may also be referred to as a functional thin film, a functional thin film layer, a functional substrate, or the like. A more detailed description of the LLO process will be described below.

The display device 100 includes a display area AA and a non-display area NA.

The display area AA is an area for displaying an image. A pixel unit including a plurality of subpixels may be disposed in the display area AA to display an image. For example, the pixel unit may consist of a plurality of subpixels including a light emitting device and a driving circuit to display an image.

The non-display area NA is an area where the image is not displayed, and an area where various lines, driving ICs, and the like are disposed to drive the subpixels disposed in the display area AA. For example, various driving ICs such as a gate driver IC and a data driver IC may be disposed in the non-display area NA.

The plurality of flexible films 160 is disposed at one end of the lower substrate 110. The plurality of flexible films 160 is electrically connected to one end of the lower substrate 110. The plurality of flexible films 160 are films for supplying signals to the plurality of subpixels of the display area AA by disposing various components on a flexible base film. One end of the plurality of flexible films 160 may be disposed in the non-display area NA to supply a data voltage or the like to the plurality of subpixels in the display area AA. Meanwhile, in FIG. 1, the plurality of flexible films 160 has been illustrated in four, but the number of the plurality of flexible films 160 may be variously changed according to a design, and is not limited thereto.

Meanwhile, the driving ICs such as a gate driver IC and a data driver IC may be disposed on the plurality of flexible films 160. The driving IC is a component that processes data for displaying an image and a driving signal for processing the data. The driving IC may be disposed by a method such as chip on glass (COG), chip on film (COF), and tape carrier package (TCP), in accordance with a mounting method. In the present disclosure, for convenience of the description, the method has been described as the chip on film method in which the driving ICs are mounted on the plurality of flexible films 160, but is not limited thereto.

The printed circuit board 170 is connected with the plurality of flexible films 160. The printed circuit board 170 is a component that supplies a signal to the driving IC. The printed circuit board 170 may be disposed with various components for supplying various driving signals such as a driving signal, and a data voltage to the driving ICs. Meanwhile, in FIG. 1, two printed circuit boards 170 have been illustrated, but the number of the printed circuit boards 170 may be variously changed according to a design, and is not limited thereto.

As mentioned above, the pixel unit may be disposed in the display area AA. The pixel unit is configured to display an image by including the plurality of subpixels. The plurality of subpixels of the pixel unit is a minimum unit constituting the display area AA, and a light emitting device and a driving circuit may be disposed in each of the plurality of subpixels. For example, the light emitting device of each of the plurality of subpixels may include an organic light emitting device including an anode, an organic light emitting layer, and a cathode, an LED including N-type and P-type semiconductor layers and a light emitting layer, or the like, but is not limited thereto. In addition, the driving circuit for driving the plurality of subpixels may include driving devices such as a thin film transistor and a storage capacitor, but is not limited thereto. Hereinafter, for convenience of description, it is assumed that the light emitting device of each of the plurality of subpixels is an organic light emitting device, but the present disclosure is not limited thereto.

Meanwhile, the display device 100 may be configured in a top emission type or a bottom emission type according to a direction in which light emitted from the light emitting device is emitted.

The top emission type is a type in which the light emitted from the light emitting device is emitted to the upper portion of the lower substrate 110 on which the light emitting device is disposed. In the case of the top emission type, a reflective layer may be formed below the anode in order to advance the light emitted from the light emitting device to the upper portion of the lower substrate 110, that is, to the cathode side.

The bottom emission type is a type in which the light emitted from the light emitting device is emitted to the lower portion of the lower substrate 110 on which the light emitting device is disposed. In the case of the bottom emission type, in order to advance the light emitted from the light emitting device to the lower portion of the lower substrate 110, the anode may be made of only a transparent conductive material, and the cathode may be made of a metal material having high reflectance.

Hereinafter, for convenience of explanation, it is assumed that the display device 100 according to the exemplary aspect of the present disclosure is a bottom emission type, but the present disclosure is not limited thereto.

An encapsulation layer may be disposed to cover the pixel unit. The encapsulation layer may seal the pixel unit to protect the light emitting device of the pixel unit from external moisture, oxygen, impact, and the like. The encapsulation layer may be constituted by a thin film encapsulation (TFE) formed by alternately stacking a plurality of inorganic material layers and a plurality of organic material layers. For example, the inorganic material layer may be made of an inorganic material such as silicon nitride (SiNx), silicon oxide (SiOx), aluminum oxide (AlOx), etc., and the organic material layer may be made of an epoxy-based or acryl-based polymer, but the present disclosure is not limited thereto. In addition, the encapsulation layer may be configured in a face seal type. For example, the encapsulation layer may be formed by forming an ultraviolet or thermosetting sealant on the entire surface of the pixel unit. However, the structure of the encapsulation layer may be formed by various methods and materials, but is not limited thereto.

Meanwhile, an encapsulation substrate made of a metal material having a high modulus and strong corrosion resistance may be further disposed on the encapsulation layer. For example, the encapsulation substrate may be made of a material having a high modulus of about 200 to 900 MPa, and made of a metal material such as aluminum (Al), nickel (Ni), chromium (Cr), iron (Fe), and an alloy material of nickel, which has strong corrosion resistance and easy processing in a foil or thin film form. Accordingly, as the encapsulation substrate is formed of a metal material, the encapsulation substrate can be implemented in an ultra-thin film form, and may provide strong protection against external impact and scratches.

A seal member may be disposed to surround side surfaces of the pixel unit and the encapsulation layer. The seal member may be disposed in the non-display area NA and may be disposed to surround the pixel unit disposed in the display area AA. The sealing member may be disposed to surround the side surface of the pixel unit and the side surface of the encapsulation layer to minimize moisture permeation into the pixel unit.

The seal member may be formed of a non-conductive material having elasticity to complement the rigidity of the side surface of the display device 100 while sealing the side surface of the pixel unit. In addition, the seal member may be made of a material having an adhesive property. In addition, the seal member may further include a moisture absorbent to minimize moisture permeation through the side of the display device 100 by absorbing moisture, oxygen, and the like from the outside. For example, the seal member may be made of a polyimide (PI), polyurethane, epoxy, or acryl-based material, but is not limited thereto.

Hereinafter, the plurality of subpixels of the pixel unit will be described in more detail with reference to FIG. 2.

Figure 2:
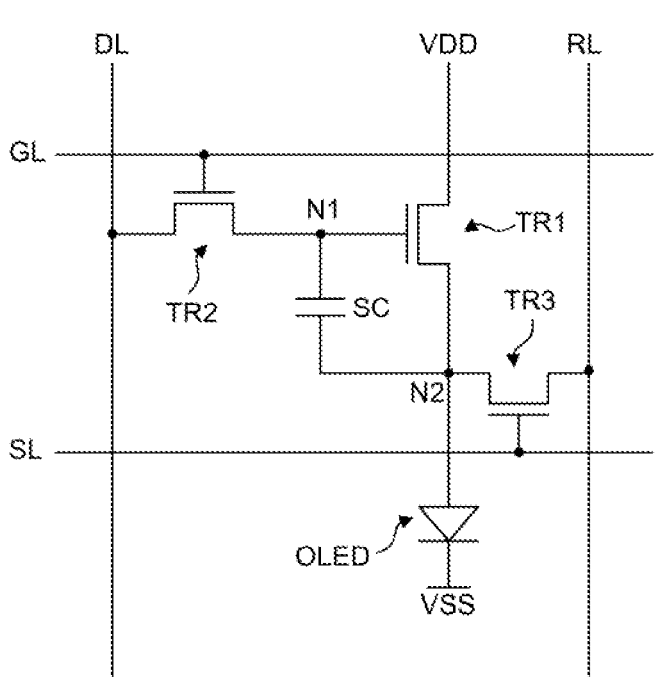
FIG. 2 is a circuit diagram of a subpixel in the display device according to the exemplary aspect of the present disclosure.

FIG. 2 is a circuit diagram of a subpixel in the display device according to the exemplary aspect of the present disclosure.

Referring to FIG. 2, a driving circuit for driving a light emitting device OLED of the plurality of subpixels SP includes a first transistor TR1, a second transistor TR2, a third transistor TR3, and a storage capacitor SC. In addition, in order to drive the driving circuit, a plurality of lines including a gate line GL, a data line DL, a high potential power line VDD, a sensing line SL, and a reference line RL is disposed on the lower substrate 110.

Each of the first transistor TR1, the second transistor TR2, and the third transistor TR3 included in the driving circuit of one subpixel SP includes a gate electrode, a source electrode, and a drain electrode.

In addition, the first transistor TR1, the second transistor TR2, and the third transistor TR3 may be P-type thin film transistors or N-type thin film transistors. For example, in the P-type thin film transistor, since holes flow from the source electrode to the drain electrode, a current may flow from the source electrode to the drain electrode. In the N-type thin film transistor, since electrons flow from the source electrode to the drain electrode, the current may flow from the drain electrode to the source electrode. Hereinafter, it is assumed that the first transistor TR1, the second transistor TR2, and the third transistor TR3 are N-type thin film transistors in which the current flows from the drain electrode to the source electrode, but the present disclosure is not limited thereto.

The first transistor TR1 includes a first active layer, a first gate electrode, a first source electrode, and a first drain electrode. The first gate electrode is connected to a first node N1, the first source electrode is connected to an anode of the light emitting device OLED, and the first drain electrode is connected to a high potential power line VDD. The first transistor TR1 may be turned on when the voltage of the first node N1 is higher than a threshold voltage, and may be turned off when the voltage of the first node N1 is lower than the threshold voltage. In addition, when the first transistor TR1 is turned on, a driving current may be transferred to the light emitting device OLED through the first transistor TR1. Accordingly, the first transistor TR1 controlling the driving current transmitted to the light emitting device OLED may be referred to as a driving transistor.

The second transistor TR2 includes a second active layer, a second gate electrode, a second source electrode, and a second drain electrode. The second gate electrode is connected to the gate line GL, the second source electrode is connected to the first node N1, and the second drain electrode is connected to the data line DL. The second transistor TR2 may be turned on or off based on the gate voltage from the gate line GL. When the second transistor TR2 is turned on, the data voltage from the data line DL may be charged in the first node N1. Accordingly, the second transistor TR2 turned on or off by the gate line GL may also be referred to as a switching transistor.

The third transistor TR3 includes a third active layer, a third gate electrode, a third source electrode, and a third drain electrode. The third gate electrode is connected to a sensing line SL, the third source electrode is connected to a second node N2, and the third drain electrode is connected to a reference line RL. The third transistor TR3 may be turned on or off based on the sensing voltage from the sensing line SL. In addition, when the third transistor TR3 is turned on, the reference voltage from the reference line RL may be transmitted to the second node N2 and the storage capacitor SC. Accordingly, the third transistor TR3 may also be referred to as a sensing transistor.

Meanwhile, although the gate line GL and the sensing line SL are illustrated as separate lines in FIG. 2, the gate line GL and the sensing line SL may be implemented as a single line, but are not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting device OLED emits light, thereby supplying a constant driving current to the light emitting device OLED. The storage capacitor SC includes a plurality of capacitor electrodes, and for example, one of the plurality of capacitor electrodes may be connected to the first node N1, and the other capacitor electrode may be connected to the second node N2.

The light emitting device OLED includes an anode, a light emitting layer, and a cathode. The anode of the light emitting device OLED is connected to the second node N2, and the cathode is connected to the low potential power line VSS. The light emitting device OLED may receive the driving current from the first transistor TR1 to emit light.

Meanwhile, in FIG. 2, the driving circuit of the subpixel SP of the display device 100 according to the exemplary aspect of the present disclosure has been described as having a 3T1C structure including three transistors and one storage capacitor SC. However, the number and the connection relationship of the transistors and the storage capacitor SC may be variously changed according to a design, but are not limited thereto.

FIG. 3 is an enlarged plan view of the display device according to the exemplary aspect of the present disclosure. FIG. 4 is a cross-sectional view taken along line IV-IV' of FIG. 3. FIG. 5 is an enlarged plan view of a lower substrate of a red subpixel of FIG. 3. FIG. 3 is an enlarged plan view for a red subpixel SPR, a white subpixel SPW, a blue subpixel SPB, and a green subpixel SPG constituting one pixel. In FIG. 3, for convenience of description, the bank 115 has been omitted, and a plurality of color filters CF is illustrated by thick solid lines. Referring to FIGS. 3 and 4, the display device 100 according to the exemplary aspect of the present disclosure includes a lower substrate 110, a buffer layer 111, a gate insulating layer 112, a passivation layer 113, a planarization layer 114, a bank 115, a first transistor TR1, a second transistor TR2, a third transistor TR3, a storage capacitor SC, a light emitting device OLED, a gate line GL, a sensing line SL, a data line DL, a reference line RL, a high potential power line VDD, and a plurality of color filters CF.

Referring to FIG. 3, the plurality of subpixels SP includes a red subpixel SPR, a green subpixel SPG, a blue subpixel SPB, and a white subpixel SPW. For example, the red subpixel SPR, the white subpixel SPW, the blue subpixel SPB, and the green subpixel SPG may be sequentially disposed along a row direction. However, the disposition order of the plurality of subpixels SP is not limited thereto.

Each of the plurality of subpixels SP includes an emission area EA and a circuit area CA. The emission area EA is an area capable of independently emitting light of one color, and may be disposed with the light emitting device OLED. Specifically, among areas where the plurality of color filters CF and the anode AN overlap with each other, an area which is exposed from the bank 115 and in which light emitted from the light emitting device OLED is directed to the outside may be defined as the emission area EA. For example, referring to FIGS. 3 and 4 together, the emission area EA of the red subpixel SPR may be an area exposed from the bank 115 among the areas where the red color filter CFR and the anode AN overlap with each other. In addition, the emission area EA of the green subpixel SPG may be an area exposed from the bank 115 among the areas where the green color filter CFG and the anode AN overlap with each other. In addition, the emission area EA of the blue subpixel SPB may be an area exposed from the bank 115 among the areas where the blue color filter CFB and the anode AN overlap with each other. In this case, the emission area EA of the white subpixel SPW in which a separate color filter CF is not disposed may be an area overlapping with a portion of the anode AN exposed from the bank 115.

The circuit area CA is an area other than the emission area EA, in which a driving circuit DP for driving a plurality of light emitting devices OLED and a plurality of lines for transmitting various signals to the driving circuit DP are disposed. In addition, the circuit area CA in which the driving circuit DP, the plurality of lines, the bank 115, and the like are disposed may be a non-emission area. For example, in the circuit area CA, the driving circuit DP including the first transistor TR1, the second transistor TR2, the third transistor TR3, and the storage capacitor SC, and a plurality of high potential power lines VDD, a plurality of data lines DL, a plurality of reference lines RL, a plurality of gate lines GL, a sensing line SL, a bank 115, and the like may be disposed.

Referring to FIGS. 3 to 5 together, the lower substrate 110 is disposed on a polarizing plate 150. The lower substrate 110 may include a plurality of first patterns PTN1. In this case, the first pattern PTN1 refers to a region that overlaps and is in contact with a light shielding layer LS disposed immediately above the lower substrate 110. In this case, the shape and the size of the first pattern PTN1 may be substantially the same as the shape and the size of the light shielding layer LS on a plane. Accordingly, the first pattern PTN1 may be disposed to overlap with the active layer of the transistor in the same manner as the light shielding layer LS.

The plurality of high potential power lines VDD, the plurality of data lines DL, the plurality of reference lines RL, and the light shielding layer LS are disposed on the lower substrate 110. The plurality of high potential power lines VDD, the plurality of data lines DL, the plurality of reference lines RL, and the light shielding layer LS may be disposed on the same layer on the lower substrate 110 and made of the same conductive material. For example, the plurality of high potential power lines VDD, the plurality of data lines DL, the plurality of reference lines RL, and the light shielding layer LS may be formed of metal materials, such as copper (Cu), aluminum (Al), molybdenum (Mo), nickel (Ni), titanium (Ti), and chromium (Cr), or alloys thereof, but are not limited thereto.

The plurality of high potential power lines VDD are lines that transmit a high potential power voltage to each of the plurality of subpixels SP. The plurality of high potential power lines VDD may extend between the plurality of subpixels SP in a column direction, and two subpixels SP adjacent to each other in a row direction may share one high potential power line VDD among the plurality of high potential power lines VDD. For example, one high potential power line VDD is disposed on the left side of the red subpixel SPR, and may supply a high potential power voltage to the first transistor TR1 of each of the red subpixel SPR and the white subpixel SPW. The other high potential power line VDD is disposed on the right side of the green subpixel SPG, and may supply a high potential power voltage to the first transistor TR1 of each of the blue subpixel SPB and the green subpixel SPG.

The plurality of data lines DL are lines which extend in a column direction between the plurality of subpixels SP to transmit a data voltage to each of the plurality of subpixels SP, and includes a first data line DL1, a second data line, a third data line DL3, and a fourth data line DL4. The first data line DL1 is disposed between the red subpixel SPR and the white subpixel SPW to transmit a data voltage to the second transistor TR2 of the red subpixel SPR. The second data line DL2 is disposed between the first data line DL1 and the white subpixel SPW to transmit a data voltage to the second transistor TR2 of the white subpixel SPW. The third data line DL3 is disposed between the blue subpixel SPB and the green subpixel SPG to transmit a data voltage to the second transistor TR2 of the blue subpixel SPB. The fourth data line DL4 is disposed between the third data line DL3 and the green subpixel SPG to transmit a data voltage to the second transistor TR2 of the green subpixel SPG.

The plurality of reference lines RL are lines extending in a column direction between the plurality of subpixels SP to transmit a reference voltage to each of the plurality of subpixels SP. A plurality of subpixels SP constituting one pixel may share one reference line RL. For example, one reference line RL is disposed between the white subpixel SPW and the blue subpixel SPB, and may transmit a reference voltage to the third transistor TR3 of each of the red subpixel SPR, the white subpixel SPW, the blue subpixel SPB, and the green subpixels SPG.

Referring to FIGS. 3 and 4 together, the light shielding layer LS is disposed on the lower substrate 110. The light shielding layer LS is disposed to overlap with a first active layer ACT1 of at least the first transistor TR1 among the plurality of transistors TR1, TR2, and TR3 to shield the light incident on the first active layer ACT1. If the light is irradiated to the first active layer ACT1, a leakage current is generated, and thus the reliability of the first transistor TR1 serving as the driving transistor may deteriorate. At this time, when the light shielding layer LS made of an opaque conductive material such as copper (Cu), aluminum (Al), molybdenum (Mo), nickel (Ni), titanium (Ti), and chromium (Cr), or an alloy thereof is disposed to overlap with the first active layer ACT1, the light incident on the first active layer ACT1 is shielded from the lower portion of the first substrate 110, thereby improving the reliability of the first transistor TR1. However, the present disclosure is not limited thereto, and the light shielding layer LS may also be disposed to overlap with a second active layer ACT2 of the second transistor TR2 and a third active layer ACT3 of the third transistor TR3.

Meanwhile, although the light shielding layer LS is illustrated as a single layer in the drawings, the light shielding layer LS may be formed of a plurality of layers. For example, the light shielding layer LS may be formed of a plurality of layers disposed to overlap with each other with at least one of the lower substrate 110, the buffer layer 111, the gate insulating layer 112, and the passivation layer 113 interposed therebetween.

The buffer layer 111 is disposed on the plurality of high potential power lines VDD, the plurality of data lines DL, the plurality of reference lines RL, and the light shielding layer LS. The buffer layer 111 may reduce penetration of moisture and impurities through the first substrate 110. For example, the buffer layer 111 may be formed of a single layer or a multilayer of silicon oxide (SiOx) or silicon nitride (SiNx), but is not limited thereto. In addition, the buffer layer 111 may also be omitted depending on a type of the first substrate 110 or a type of the transistor, but is not limited thereto.

The first transistor TR1, the second transistor TR2, the third transistor TR3, and the storage capacitor SC are disposed on the buffer layer 111 in each of the plurality of subpixels SP.

First, the first transistor TR1 includes a first active layer ACT1, a first gate electrode GE1, a first source electrode SE1, and a first drain electrode DE1.

The first active layer ACT1 is disposed on the buffer layer 111. The first active layer ACT1 may be made of a semiconductor material such as an oxide semiconductor, amorphous silicon, or polysilicon, but is not limited thereto. For example, when the first active layer ACT1 is formed of the oxide semiconductor, the first active layer ACT1 may include a channel region, a source region, and a drain region, and the source region and the drain region may be conductive regions. However, the present disclosure is not limited thereto.

The gate insulating layer 112 is disposed on the first active layer ACT1. The gate insulating layer 112 is a layer for insulating the first gate electrode GE1 from the first active layer ACT1 and may be made of an insulating material. For example, the gate insulating layer 112 may be formed of a single layer or a multilayer of silicon oxide (SiOx) or silicon nitride (SiNx), but is not limited thereto.

The first gate electrode GE1 is disposed on the gate insulating layer 112 to overlap with the first active layer ACT1. The first gate electrode GE1 may be formed of a conductive material, for example, copper (Cu), aluminum (Al), molybdenum (Mo), nickel (Ni), titanium (Ti), chromium (Cr), or alloys thereof, but is not limited thereto.

The first source electrode SE1 and the first drain electrode DE1 spaced apart from each other are disposed on the gate insulating layer 112. The first source electrode SE1 and the first drain electrode DE1 may be electrically connected to the first active layer ACT1 through a contact hole formed in the gate insulating layer 112. The first source electrode SE1 and the first drain electrode DE1 are disposed on the same layer as the first gate electrode GE1 and may be formed of the same conductive material, but are not limited thereto. For example, the first source electrode SE1 and the first drain electrode DE1 may be formed of copper (Cu), aluminum (Al), molybdenum (Mo), nickel (Ni), titanium (Ti), chromium (Cr), or an alloy thereof, but are not limited thereto.

The first drain electrode DE1 is electrically connected to the high potential power line VDD. For example, the first drain electrodes DE1 of the red subpixel SPR and the white subpixel SPW may be electrically connected to the high potential power line VDD on the left side of the red subpixel SPR. The first drain electrodes DE1 of the blue subpixel SPB and the green subpixel SPG may be electrically connected to the high potential power line VDD on the right side of the green subpixel SPG.

In this case, in order to electrically connect the first drain electrode DE1 to the high potential power line VDD, an auxiliary high potential power line VDDa may be further disposed. One end of the auxiliary high potential power line VDDa may be electrically connected to the high potential power line VDD, and the other end thereof may be electrically connected to the first drain electrode DE1 of each of the plurality of subpixels SP. For example, when the auxiliary high potential power line VDDa is formed of the same material on the same layer as that of the first drain electrode DE1, one end of the auxiliary high potential power line VDDa may be electrically connected to the high potential power line VDD through contact holes formed in the gate insulating layer 112 and the buffer layer 111. In addition, the other end of the auxiliary high potential power line VDDa may extend toward the first drain electrode DE1 to be formed integrally with the first drain electrode DE1.

In this case, the first drain electrode DE1 of the red subpixel SPR and the first drain electrode DE1 of the white subpixel SPW electrically connected to the same high potential power line VDD may be connected to the same auxiliary high potential power line VDDa. The first drain electrode DE1 of the blue subpixel SPB and the first drain electrode DE1 of the green subpixel SPG may also be connected to the same auxiliary high potential power line VDDa. However, the first drain electrode DE1 and the high potential power line VDD may be electrically connected to each other by a different method, but are not limited thereto.

The first source electrode SE1 may be electrically connected to the light shielding layer LS through contact holes formed in the gate insulating layer 112 and the buffer layer 111. In addition, a portion of the first active layer ACT1 connected to the first source electrode SE1 may be electrically connected to the light shielding layer LS through the contact hole formed in the buffer layer 111. If the light shielding layer LS is floating, a threshold voltage of the first transistor TR1 may be changed, thereby affecting the driving of the display device 100. Accordingly, the light shielding layer LS may be electrically connected to the first source electrode SE1 to apply the voltage to the light shielding layer LS and not to affect the driving of the first transistor TR1. However, in the present disclosure, it has been described that both the first active layer ACT1 and the first source electrode SE1 are in contact with the light shielding layer LS, but only one of the first source electrode SE1 and the first active layer ACT1 may be in direct contact with the light shielding layer LS, but it is not limited thereto.

Meanwhile, in FIG. 4, it is illustrated that the gate insulating layer 112 is patterned to overlap with the first gate electrode GE1, the first source electrode SE1, and the first drain electrode DE1, but the gate insulating layer 112 may be formed on the entire surface of the lower substrate 110, but is not limited thereto.

The second transistor TR2 includes a second active layer ACT2, a second gate electrode GE2, a second source electrode SE2, and a second drain electrode DE2.

The second active layer ACT2 is disposed on the buffer layer 111. The second active layer ACT2 may be made of a semiconductor material such as an oxide semiconductor, amorphous silicon, or polysilicon, but is not limited thereto. For example, when the second active layer ACT2 is formed of the oxide semiconductor, the second active layer ACT2 may include a channel region, a source region, and a drain region, and the source region and the drain region may be conductive regions. However, the present disclosure is not limited thereto.

The second source electrode SE2 is disposed on the buffer layer 111. The second source electrode SE2 may be formed integrally with the second active layer ACT2 to be electrically connected to each other. For example, the second source electrode SE2 may be formed by forming a semiconductor material on the buffer layer 111 and conducting a portion of the semiconductor material. Accordingly, the non-conducted portion of the semiconductor material may become the second active layer ACT2, and the conducted portion may become the second source electrode SE2. However, the second active layer ACT2 and the second source electrode SE2 may be separately formed, but the present disclosure is not limited thereto.

The second source electrode SE2 is electrically connected to the first gate electrode GE1 of the first transistor TR1. The first gate electrode GE1 may be electrically connected to the second source electrode SE2 through the contact hole formed on the gate insulating layer 112. Accordingly, the first transistor TR1 may be turned on or off by a signal from the second transistor TR2.

The gate insulating layer 112 is disposed on the second active layer ACT2 and the second source electrode SE2, and the second drain electrode DE2 and the second gate electrode GE2 are disposed on the gate insulating layer 112.

The second gate electrode GE2 is disposed on the gate insulating layer 112 to overlap with the second active layer ACT2. The second gate electrode GE2 may be electrically connected to the gate line GL, and the second transistor TR2 may be turned on or off based on the gate voltage transmitted to the second gate electrode GE2. The second gate electrode GE2 may be formed of a conductive material, for example, copper (Cu), aluminum (Al), molybdenum (Mo), nickel (Ni), titanium (Ti), chromium (Cr), or alloys thereof, but is not limited thereto.

Meanwhile, the second gate electrode GE2 may extend from the gate line GL. That is, the second gate electrode GE2 may be formed integrally with the gate line GL, and the second gate electrode GE2 and the gate line GL may be formed of the same conductive material. For example, the gate line GL may be formed of copper (Cu), aluminum (Al), molybdenum (Mo), nickel (Ni), titanium (Ti), chromium (Cr), or an alloy thereof, but is not limited thereto.

The gate line GL is a line that transmits a gate voltage to each of the plurality of subpixels SP, and may be extended in a row direction across the circuit area CA of the plurality of subpixels SP. The gate line GL may be extended in the row direction to cross the plurality of high potential power lines VDD, the plurality of data lines DL, and the plurality of reference lines RL extending in the column direction.

The second drain electrode DE2 is disposed on the gate insulating layer 112. The second drain electrode DE2 may be electrically connected to the second active layer ACT2 through the contact hole formed in the gate insulating layer 112. Simultaneously, the second drain electrode DE2 may be electrically connected to one data line of the plurality of data lines DL through the contact holes formed in the gate insulating layer 112 and the buffer layer 111. For example, the second drain electrode DE2 of the red subpixel SPR may be electrically connected to the first data line DL1, and the second drain electrode DE2 of the white subpixel SPW may be electrically connected to the second data line DL2. For example, the second drain electrode DE2 of the blue subpixel SPB may be electrically connected to the third data line DL3, and the second drain electrode DE2 of the green subpixel SPG may be electrically connected to the fourth data line DL4. The second drain electrode DE2 may be formed of a conductive material, for example, copper (Cu), aluminum (Al), molybdenum (Mo), nickel (Ni), titanium (Ti), chromium (Cr), or alloys thereof, but is not limited thereto.

The third transistor TR3 includes a third active layer ACT3, a third gate electrode GE3, a third source electrode SE3, and a third drain electrode DE3.

The third active layer ACT3 is disposed on the buffer layer 111. The third active layer ACT3 may be made of a semiconductor material such as an oxide semiconductor, amorphous silicon, or polysilicon, but is not limited thereto. For example, when the third active layer ACT3 is formed of the oxide semiconductor, the third active layer ACT3 may include a channel region, a source region, and a drain region, and the source region and the drain region may be conductive regions. However, the present disclosure is not limited thereto.

The gate insulating layer 112 is disposed on the third active layer ACT3 and the third gate electrode GE3, the third source electrode SE3, and the third drain electrode DE3 are disposed on the gate insulating layer 112.

The third gate electrode GE3 is disposed on the gate insulating layer 112 to overlap with the third active layer ACT3. The third gate electrode GE3 may be electrically connected to the sensing line SL, and the third transistor TR3 may be turned on or off based on the sensing voltage transmitted to the third transistor TR3. The third gate electrode GE3 may be formed of a conductive material, for example, copper (Cu), aluminum (Al), molybdenum (Mo), nickel (Ni), titanium (Ti), chromium (Cr), or alloys thereof, but is not limited thereto.

Meanwhile, the third gate electrode GE3 may extend from the sensing line SL. That is, the third gate electrode GE3 may be formed integrally with the sensing line SL, and the third gate electrode GE3 and the sensing line SL may be formed of the same conductive material. For example, the sensing line SL may be formed of copper (Cu), aluminum (Al), molybdenum (Mo), nickel (Ni), titanium (Ti), chromium (Cr), or an alloy thereof, but is not limited thereto.

The sensing line SL is a line that transmits a sensing voltage to each of the plurality of subpixels SP, and extends between the plurality of subpixels SP in a row direction. For example, the sensing line SL is disposed to extend in the row direction at a boundary between the plurality of subpixels SP, and may cross the plurality of high potential power lines VDD, the plurality of data lines DL, and the plurality of reference lines RL extending in the column direction.

The third source electrode SE3 may be electrically connected to the third active layer ACT3 through the contact hole formed in the gate insulating layer 112. The third source electrode SE3 may be formed of a conductive material, for example, copper (Cu), aluminum (Al), molybdenum (Mo), nickel (Ni), titanium (Ti), chromium (Cr), or alloys thereof, but is not limited thereto.

Meanwhile, a portion of the third active layer ACT3 in contact with the third source electrode SE3 may be electrically connected to the light shielding layer LS through the contact hole formed in the buffer layer 111. That is, the third source electrode SE3 may be electrically connected to the light shielding layer LS with the third active layer ACT3 interposed therebetween. Therefore, the third source electrode SE3 and the first source electrode SE1 may be electrically connected to each other through the light shielding layer LS.

The third drain electrode DE3 may be electrically connected to the third active layer ACT3 through the contact hole formed in the gate insulating layer 112. The third drain electrode DE3 may be formed of a conductive material, for example, copper (Cu), aluminum (Al), molybdenum (Mo), nickel (Ni), titanium (Ti), chromium (Cr), or alloys thereof, but is not limited thereto.

The third drain electrode DE3 may be electrically connected to the reference line RL. For example, the third drain electrode DE3 of each of the red subpixel SPR, the white subpixel SPW, the blue subpixel SPB, and the green subpixel SPG constituting one pixel may be electrically connected to the same reference line RL. That is, the plurality of subpixels SP constituting one pixel may share one reference line RL.

In this case, an auxiliary reference line RLa may be disposed to transmit the reference line RL extending in the column direction to the plurality of subpixels SP disposed side by side in the row direction. The auxiliary reference line RLa may extend in the row direction to electrically connect the reference line RL with the third drain electrode DE3 of each of the plurality of subpixels SP. One end of the auxiliary reference line RLa may be electrically connected to the reference line RL through the contact holes formed in the buffer layer 111 and the gate insulating layer 112. In addition, the other end of the auxiliary reference line RLa may be electrically connected to the third drain electrode DE3 of each of the plurality of subpixels SP. In this case, the auxiliary reference line RLa may be formed integrally with the third drain electrode DE3 of each of the plurality of subpixels SP, and the reference voltage from the reference line RL may be transmitted to the third drain electrode DE3 through the auxiliary reference line RLa. However, the auxiliary reference line RLa may be formed separately from the third drain electrode DE3, but is not limited thereto.

The storage capacitor SC is disposed in the circuit area CA of the plurality of subpixels SP. The storage capacitor SC may store a voltage between the first gate electrode GE1 and the first source electrode SE1 of the first transistor TR1 so that the light emitting device OLED is continuously maintained in the same state for one frame. The storage capacitor SC includes a first capacitor electrode SC1, a second capacitor electrode SC2, and a third capacitor electrode SC3.

The first capacitor electrode SC1 is disposed under the buffer layer 111 in each of the plurality of subpixels SP. The first capacitor electrode SC1 may be disposed closest to the first substrate 110 among the conductive components disposed on the first substrate 110. The first capacitor electrode SC1 may be formed integrally with the light shielding layer LS and may be electrically connected to the first source electrode SE1 through the light shielding layer LS.

The buffer layer 111 is disposed on the first capacitor electrode SC1, and the second capacitor electrode SC2 is disposed on the buffer layer 111. The second capacitor electrode SC2 may be disposed to overlap with the first capacitor electrode SC1. The second capacitor electrode SC2 may be formed integrally with the second source electrode SE2, and may be electrically connected to the second source electrode SE2 and the first gate electrode GE1. For example, the second source electrode SE2 and the second capacitor electrode SC2 may be formed by forming a semiconductor material on the buffer layer 111 and conducting a portion of the semiconductor material. Therefore, the non-conducted portion of the semiconductor material may function as the second active layer ACT2, and the conducted portion may function as the second source electrode SE2 and the second capacitor electrode SC2. In addition, as described above, the first gate electrode GE1 is electrically connected to the second source electrode SE2 through the contact hole formed in the gate insulating layer 112. Accordingly, the second capacitor electrode SC2 may be formed integrally with the second source electrode SE2 to be electrically connected to the second source electrode SE2 and the first gate electrode GE1.

The passivation layer 113 is disposed on the second capacitor electrode SC2, and the third capacitor electrode SC3 is disposed on the passivation layer 113. The third capacitor electrode SC3 may be disposed to overlap with the first capacitor electrode SC1 and the second capacitor electrode SC3. The third capacitor electrode SC3 may be formed integrally with the anode AN and may be electrically connected to the first source electrode SE1.

In summary, the first capacitor electrode SC1 of the storage capacitor SC is formed integrally with the light shielding layer LS to be electrically connected to the light shielding layer LS, the first source electrode SE1, and the third source electrode SE3. In addition, the second capacitor electrode SC2 may be formed integrally with the second source electrode SE2 and the second active layer ACT2 to be electrically connected to the second source electrode SE2 and the first gate electrode GE1. In addition, the third capacitor electrode SC3 may be formed integrally with the anode AN to be electrically connected to the first source electrode SE1 and the third source electrode SE3. Accordingly, the first capacitor electrode SC1 and the second capacitor electrode SC2 overlapping with each other with the buffer layer 111 interposed therebetween, and the second capacitor electrode SC2 and the third capacitor electrode SC3 overlapping with each other with the passivation layer 113 interposed therebetween may maintain the voltages of the first gate electrode GE1 and the first source electrode SE1 of the first transistor TR1 while the light emitting device OLED emits the light. As a result, the light emitting device OLED may be maintained in the same state.

Referring to FIGS. 3 and 4, the passivation layer 113 is disposed on the first transistor TR1, the second transistor TR2, the third transistor TR3, and the storage capacitor SC. The passivation layer 113 is an insulating layer for protecting the lower portion of the passivation layer 113. For example, the passivation layer 113 may be formed of a single layer or a multilayer of silicon oxide (SiOx) or silicon nitride (SiNx), but is not limited thereto. In addition, the passivation layer 113 may also be omitted according to an exemplary aspect.

The plurality of color filters CF is disposed in the emission area EA of each of the plurality of subpixels SP on the passivation layer 113. As described above, since the display device 100 according to the exemplary aspect of the present disclosure is the bottom emission type in which the light emitted from the light emitting device OLED is directed downwards of the light emitting device OLED and the first substrate 110, the plurality of color filters CF may be disposed below the light emitting device OLED. The light emitted from the light emitting device OLED may be implemented as light of various colors by passing through the plurality of color filters CF.

The plurality of color filters CFs includes a red color filter CFR, a blue color filter CFB, and a green color filter CFG. The red color filter CFR may be disposed in the emission area EA of the red subpixel SPR among the plurality of subpixels SP, the blue color filter CFB may be disposed in the emission area EA of the blue subpixel SPB, and the green color filter CFG may be disposed in the emission area EA of the green subpixel SPG.

The planarization layer 114 is disposed on the passivation layer 113 and the plurality of color filters CF. The planarization layer 114 is an insulating layer for planarizing the upper portion of the first substrate 110 in which the first transistor TR1, the second transistor TR2, the third transistor TR3, the storage capacitor SC, the plurality of high potential power lines VDD, the plurality of data lines DL, the plurality of reference lines RL, the plurality of gate lines GL, and the plurality of sensing lines SL are disposed. The planarization layer 114 may be made of an organic material, for example, a single layer or a multilayer of polyimide or photo acryl, but is not limited thereto.

The light emitting device OLED is disposed in the emission area EA in each of the plurality of subpixels SP. The light emitting device OLED is disposed on the planarization layer 114 in each of the plurality of subpixels SP. The light emitting device OLED includes an anode AN, a light emitting layer EL, and a cathode CA.

The anode AN is disposed on the planarization layer 114 in the emission area EA. Since the anode AN supplies holes to the light emitting layer EL, the anode AN is made of a conductive material having a high work function, which may also be referred to as an anode AN. The anode AN may be formed of, for example, a transparent conductive material such as indium tin oxide (ITO) or indium zinc oxide (IZO), but is not limited thereto.

Meanwhile, the anode AN may extend toward the circuit area CA. A portion of the anode AN may extend toward the first source electrode SE1 of the circuit area CA from the emission area EA, and may be electrically connected to the first source electrode SE1 through contact holes formed in the planarization layer 114 and the passivation layer 113. Accordingly, the anode AN of the light emitting device OLED extends to the circuit area CA so as to be electrically connected to the first source electrode SE1 of the first transistor TR1 and the second capacitor electrode SC2 of the storage capacitor SC.

The light emitting layer EL is disposed on the anode AN in the emission area EA and the circuit area CA. The light emitting layer EL may be formed as one layer over the plurality of subpixels SP. That is, the light emitting layers EL of the plurality of subpixels SP may be connected to each other to be formed integrally. The light emitting layer EL may also consist of one light emitting layer, or may have a structure in which a plurality of light emitting layers emitting light of different colors is stacked. The light emitting layer EL may further include an organic layer such as a hole injection layer, a hole transport layer, an electron transport layer, and an electron injection layer.

The cathode CA is disposed on the light emitting layer EL in the emission area EA and the circuit area CA. The cathode CA may supply electrons to the light emitting layer EL and may be made of a conductive material having a low work function. The cathode CA may be formed as one layer over the plurality of subpixels SP. That is, the cathode CA of the plurality of subpixels SP may be connected to each other to be formed integrally. The cathode CA may be formed of, for example, a transparent conductive material such as indium tin oxide (ITO) and indium zinc oxide (IZO) or a ytterbium (Yb) alloy, and may further include a metal doping layer, but is not limited thereto. Meanwhile, although not illustrated in FIGS. 4 and 5, the cathode CA of the light emitting device OLED may be electrically connected to the low potential power line VSS to receive a low potential power voltage.

The bank 115 is disposed between the anode AN and the light emitting layer EL. The bank 115 is disposed to overlap with the display area AA and to cover an edge of the anode AN. The bank 115 is disposed at the boundary between the subpixels SP adjacent to each other to reduce mixed colors of light emitted from the light emitting devices OLED of each of the plurality of subpixels SP. The bank 115 may be made of an insulating material, for example, a polyimide, acryl, or benzocyclobutene (BCB) resin, but is not limited thereto.

In addition, referring to FIG. 4, the polarizing plate 150 is disposed below the lower substrate 110. The polarizing plate 150 may selectively transmit light to reduce reflection of external light incident to the lower substrate 110. Specifically, in the display device 100, various metal materials applied to the semiconductor devices, the lines, the light emitting device, and the like are formed on the lower substrate 110. Accordingly, the external light incident to the lower substrate 110 may be reflected from the metal material, and the visibility of the display device 100 may be reduced due to the reflection of the external light. In this case, the polarizing plate 150 for blocking the reflection of external light may be disposed below the lower substrate 110 to increase outdoor visibility of the display device 100. However, the polarizing plate 150 may also be omitted depending on an implementation aspect of the display device 100.

Meanwhile, although not illustrated in the drawings, a barrier film may be disposed together with the polarizing plate 150 under the lower substrate 110. The barrier film may protect the pixel unit including the light emitting device by minimizing moisture and oxygen outside the lower substrate 110 from penetrating into the lower substrate 110. However, the barrier film may also be omitted depending on an implementation aspect of the display device 100, but is not limited thereto.

In the display device 100 according to the exemplary aspect of the present disclosure, the thickness of the display device 100 may be reduced by forming the lower substrate 110 of any one of a transparent conductive oxide and an oxide semiconductor. Conventionally, a plastic substrate has been mainly used as the substrate of the display device. However, since the plastic substrate is formed by coating and curing a substrate material at a high temperature, there is a problem that it takes a long time and it is difficult to form the thickness to be thin at a predetermined level or less. Unlike this, the transparent conductive oxide and the oxide semiconductor may be formed at a very thin thickness through a deposition process such as sputtering. Accordingly, in the display device 100 according to the exemplary aspect of the present disclosure, the lower substrate 110 supporting various components of the display device 100 is formed of a transparent conductive oxide layer or an oxide semiconductor layer, thereby reducing the thickness of the display device 100 and implementing a slim design.

Meanwhile, the flexible display device has been formed by forming the light emitting device and the driving circuit on the plastic substrate that is relatively more flexible than a glass substrate. However, when the display device is excessively deformed, the display device may be damaged by stress generated during the deformation. Accordingly, in order to further improve the flexibility to relieve the stress of the display device, it is more advantageous to reduce the thickness of the display device, but as described above, there is a problem that it is difficult to form the plastic substrate at a predetermined level or less of thickness.

Accordingly, in the display device 100 according to the exemplary aspect of the present disclosure, the lower substrate 110 is formed of a transparent conductive oxide or an oxide semiconductor to improve the flexibility of the display device 100 and reduce the stress generated when deforming the display device 100. Specifically, when the lower substrate 110 is formed of the transparent conductive oxide or the oxide semiconductor, the lower substrate 110 is able to be formed as a very thin film. In this case, the lower substrate 110 may also be referred to as a first transparent thin film layer. Accordingly, the display device 100 including the lower substrate 110 may have high flexibility, and the display device 100 may be easily bent or rolled. Accordingly, in the display device 100 according to the exemplary aspect of the present disclosure, the lower substrate 110 is formed of any one of a transparent conductive oxide layer and an oxide semiconductor layer to improve the flexibility of the display device 100 and also reduce the stress generated during deformation of the display device 100, thereby minimizing cracks in the display device 100 from occurring.

On the other hand, the flexible display device has been implemented using a plastic substrate instead of a glass substrate, but the plastic substrate is more likely to generate static electricity than the glass substrate. Such static electricity affects various lines and driving devices on the plastic substrate to damage some components or decrease the display quality of the display device. Therefore, a separate component has been required for blocking and discharging static electricity in the display device using the plastic substrate.

In the display device 100 according to the exemplary aspect of the present disclosure, the possibility of generating static electricity in the lower substrate 110 may be reduced by forming the lower substrate 110 of any one of a transparent conductive oxide layer and an oxide semiconductor layer. When the lower substrate 110 is made of plastic to generate static electricity, various lines and driving devices on the lower substrate 110 are damaged or the driving is affected due to the static electricity deteriorating the display quality. Instead, when the lower substrate 110 is formed of the transparent conductive oxide layer or the oxide semiconductor layer, it is possible to minimize the generation of static electricity in the lower substrate 110 and simplify the configuration for blocking and discharging static electricity. Accordingly, in the display device 100 according to the exemplary aspect of the present disclosure, the lower substrate 110 is formed of either a transparent conductive oxide layer or an oxide semiconductor layer having a low possibility of generating static electricity to minimize the damage or deterioration of the display quality due to static electricity.

Meanwhile, in the case of using a plastic substrate as the substrate of the display device, foreign materials may occur in the process of forming the plastic substrate. For example, in order to form the plastic substrate, foreign materials may occur when coating and curing the substrate material. In addition, due to these foreign materials, the moisture and oxygen may penetrate more easily into the display device, or several components on the substrate may be formed uniformly due to the foreign materials themselves. Accordingly, in the plastic substrate formed by coating and curing methods, the foreign materials may deteriorate the light emitting device inside the display device or decrease the characteristics of the transistors.

In contrast, in the display device 100 according to the exemplary aspect of the present disclosure, the lower substrate 110 is formed of one of the transparent conductive oxide and the oxide semiconductor to minimize external moisture or oxygen from penetrating into the display device 100 through the lower substrate 110. When the lower substrate 110 is formed of the transparent conductive oxide layer or the oxide semiconductor, the lower substrate 110 is formed in a vacuum environment, so the possibility of generating the foreign materials is significantly low. In addition, even if the foreign materials are generated, the size of the foreign materials is very small to minimize the moisture and oxygen from penetrating into the display device 100. Therefore, in the display device 100 according to the exemplary aspect of the present disclosure, the first substrate 110 is formed of a transparent conductive oxide or oxide semiconductor having a low possibility of generating foreign materials and excellent moisture permeability, thereby improving the reliability of the light emitting device OLED including the organic layer and the display device 100.

In addition, in the display device 100 according to the exemplary aspect of the present disclosure, the lower substrate 110 may be formed of either a transparent conductive oxide or an oxide semiconductor, and may be used by attaching a thin and inexpensive barrier film to the lower portion of the lower substrate 110. When the lower substrate 110 is formed of a material with low moisture permeability, for example, plastic, etc., the low moisture permeability may be compensated by attaching a thick and expensive barrier film with high performance. However, in the display device 100 according to the exemplary aspect of the present disclosure, since the lower substrate 110 is formed of a transparent conductive oxide or an oxide semiconductor having excellent moisture permeability, it is possible to attach a thin and inexpensive barrier film to the lower portion of the lower substrate 110. Accordingly, in the display device 100 according to the exemplary aspect of the present disclosure, the lower substrate 110 is formed of either a transparent conductive oxide or an oxide semiconductor having excellent moisture permeability to reduce the manufacturing cost of the display device.

In the display device 100 according to the exemplary aspect of the present disclosure, the lower substrate 110 is formed of either the transparent conductive oxide or the oxide semiconductor to perform a laser lift off (LLO) process. When manufacturing the display device 100, the pixel unit may be formed on the lower substrate 110 after attaching a temporary substrate in which a sacrificial layer is formed under the lower substrate 110. The sacrificial layer may be used with, for example, hydrogenated amorphous silicon, hydrogenated amorphous silicon doped with impurities, or the like. In addition, after the manufacturing of the display device 100 is completed, the hydrogen of the sacrificial layer is dehydrated when the laser is irradiated below the temporary substrate, and the sacrificial layer and the temporary substrate may be separated from the lower substrate 110. In this case, since the transparent conductive oxide and the oxide semiconductor are materials capable of performing the LLO process with the sacrificial layer and the temporary substrate, the lower substrate 110 is formed of either the transparent conductive oxide or the oxide semiconductor to easily separate the temporary substrate from the lower substrate 110. Therefore, in the display device 100 according to the exemplary aspect of the present disclosure, since the lower substrate 110 is formed of either the transparent conductive oxide layer or the oxide semiconductor capable of performing the LLO process, it is possible to easily manufacture the display device 100 by existing processes and equipment.

Meanwhile, recently, as the integration of the components of the display device has been advanced, such as increasing the resolution of the display device, the intervals between the lines of the driving circuit are decreased and the intervals between the transistors are decreased, so that the intervals between the conductive components have been decreased. As a result, parasitic capacitance may be generated between the lines or the transistors in the driving circuit. As such, when the parasitic capacitance is generated, the characteristics of the transistor may also be changed, and the signals applied to the lines may be coupled to each other to cause interference such as RC delay.

Accordingly, in the display device 100 according to the exemplary aspect of the present disclosure, the lower substrate 110 formed of the transparent conductive oxide or the oxide semiconductor instead of the plastic substrate includes a plurality of first patterns PTN1 overlapping and in contact with the light shielding layer LS. When the plurality of first patterns PTN1 overlapping with the light shielding layer LS is spaced apart from the light shielding layer LS positioned thereon, parasitic capacitance may be generated between the light shielding layer LS and the plurality of first patterns PTN1. At this time, since the light shielding layer LS is electrically connected to the first source electrode SE1 of the first transistor TR1, when the parasitic capacitance is generated in the light shielding layer LS, it may affect the characteristics of the first transistor TR1 and affect the driving of the display device 100. Accordingly, in the display device 100 according to the exemplary aspect of the present disclosure, the lower substrate 110 uses the plurality of first patterns PTN1 overlapping and in contact with the light shielding layer LS, thereby reducing the generation of the parasitic capacitance between the lower substrate 110 and other conductive components while enabling the LLO process.

FIG. 6 is an enlarged plan view of a display device according to another exemplary aspect of the present disclosure. FIG. 7 is a cross-sectional view taken along line VII-VII' of FIG. 6. FIG. 8 is an enlarged plan view of a lower substrate of a red subpixel of FIG. 6. As compared with the display device 100 of FIGS. 1 to 5, a display device 200 of FIG. 6 is substantially the same as the display device 100 in other configurations except that a lower substrate 210 further includes a second pattern PTN2, and thus, the duplicated description will be omitted.

Referring to FIGS. 6 to 8, the lower substrate 210 formed of a transparent conductive oxide or an oxide semiconductor includes a plurality of first patterns PTN1 and a plurality of second patterns PTN2. The plurality of first patterns PTN1 is disposed to overlap with the light shielding layer LS and in contact with the light shielding layer LS. The plurality of first patterns PTN1 is substantially the same as the plurality of first patterns PTN1 described with reference to FIGS. 1 to 5.

The plurality of second patterns PTN2 overlaps with the signal lines and may be in contact with the signal lines. Here, the signal line is a line which is disposed in the display area AA, made of the same material as the light shielding layer LS, and disposed on the same layer. In this case, the signal lines may be the high potential power line VDD, the plurality of data lines DL, and the plurality of reference lines RL, but are not limited thereto. Thus, the plurality of second patterns PTN2 may be disposed to be in contact with the lower surfaces of the high potential power line VDD, the plurality of data lines DL, and the plurality of reference lines RL. At this time, on the plane, the shape and the size of the second patterns PTN2 may be substantially the same as those of the high potential power line VDD, the plurality of data lines DL, and the plurality of reference lines RL.

In the display device 200 according to another exemplary aspect of the present disclosure, the lower substrate 210 is formed of either a transparent conductive oxide or an oxide semiconductor to perform an LLO process. In particular, in the display device 200 according to another exemplary aspect of the present disclosure, the lower substrate 110 includes a plurality of first patterns PTN1 and a plurality of second patterns PTN2 to further increase the area of the lower substrate 110. Therefore, the lower substrate 210 and the temporary substrate may be easily separated from each other.

In addition, in the display device 200 according to another exemplary aspect of the present disclosure, the lower substrate 210 formed of the transparent conductive oxide or the oxide semiconductor instead of the plastic substrate includes the plurality of first patterns PTN1 overlapping and in contact with the light shielding layer LS and the plurality of second patterns PTN2 overlapping and in contact with the signal lines. In particular, the plurality of second patterns PTN2, which overlaps with signal lines such as the high potential power line VDD, the plurality of data lines DL, and the plurality of reference lines RL, is spaced apart from the high potential power line VDD, the plurality of data lines DL, and the plurality of reference lines RL located thereon. At this time, parasitic capacitance may be generated between the signal lines and the plurality of second patterns PTN2. In this case, when the parasitic capacitance is generated in the signal lines, interference such as RC delay may occur in signals transmitted by the signal lines. Accordingly, in the display device 200 according to another exemplary aspect of the present disclosure, the lower substrate 110 uses the plurality of first patterns PTN1 overlapping and in contact with the light shielding layer LS and the plurality of second patterns PTN2 overlapping and in contact with the signal lines. As a result, it is possible to reduce the generation of the parasitic capacitance between the lower substrate 210 and other conductive components while enabling the LLO process.

FIG. 9 is an enlarged plan view of a display device according to yet another exemplary aspect of the present disclosure. FIG. 10 is a cross-sectional view taken along line X-X' of FIG. 9. FIG. 11 is an enlarged plan view of a lower substrate of a red subpixel of FIG. 9. As compared with the display device 200 of FIGS. 6 to 8, a display device 300 of FIGS. 9 to 11 is substantially the same as the display device 200 in other configurations except that a lower substrate 310 further includes a third pattern PTN3, and thus, the duplicated description will be omitted.

Referring to FIGS. 9 to 11, the lower substrate 310 formed of a transparent conductive oxide or an oxide semiconductor includes a plurality of first patterns PTN1, a plurality of second patterns PTN2, and a plurality of third patterns PTN3. The plurality of first patterns PTN1 is disposed to overlap with the light shielding layer LS and in contact with the light shielding layer LS. The plurality of second patterns PTN2 overlaps with the signal line and may be in contact with the signal line. The plurality of first patterns PTN1 is substantially the same as the plurality of first patterns PTN1 described in FIGS. 1 to 5, and the plurality of second patterns PTN2 is substantially the same as the plurality of second patterns PTN2 described in FIGS. 6 to 8.

The plurality of third patterns PTN3 overlaps with the emission area EA. That is, the plurality of third patterns PTN3 may be disposed only in the emission area EA of the emission area EA and the circuit area CA in each of the plurality of subpixels SP. Thus, the plurality of third patterns PTN3 may be disposed in a region exposed from the bank 115 in an area where the plurality of color filters CF and the anode AN overlap with each other. In this case, the shape and the size of the third patterns PTN3 may be substantially the same as the shape and the size of the emission area EA on a plane.

In the display device 300 according to yet another exemplary aspect of the present disclosure, the lower substrate 310 is formed of either a transparent conductive oxide or an oxide semiconductor to perform an LLO process. In particular, in the display device 300 according to yet another exemplary aspect of the present disclosure, the lower substrate 310 includes the plurality of first patterns PTN1, the plurality of second patterns PTN2, and the plurality of third patterns PTN3 to further increase the area of the lower substrate 310. Therefore, the lower substrate 310 and the temporary substrate may be easily separated from each other.

In addition, in the display device 300 according to yet another exemplary aspect of the present disclosure, the lower substrate 310 formed of the transparent conductive oxide or the oxide semiconductor instead of the plastic substrate includes the plurality of first patterns PTN1 overlapping and in contact with the light shielding layer LS, the plurality of second patterns PTN2 overlapping and in contact with the signal lines, and the plurality of third patterns PTN3 overlapping with the emission area EA. In particular, the plurality of third patterns PTN3 is disposed in the emission area EA in which the conductive component is not disposed below the anode AN. Accordingly, in the display device 300 according to yet another exemplary aspect of the present disclosure, the plurality of third patterns PTN3 is added to minimize the generation of the parasitic capacitance between the plurality of third patterns PTN3 and other conductive components while further facilitating the LLO process. That is, since a conductive component such as a line or a transistor is not disposed between the plurality of third patterns PTN3 and the anode AN, the parasitic capacitance between the plurality of third patterns PTN3 and the line or transistor may be not generated. Accordingly, in the display device 300 according to yet another exemplary aspect of the present disclosure, the lower substrate 310 uses the plurality of first patterns PTN1 overlapping and in contact with the light shielding layer LS, the plurality of second patterns PTN2 overlapping and in contact with the signal lines, and the plurality of third patterns PTN3 overlapping with the emission area EA. As a result, it is possible to reduce the generation of the parasitic capacitance between the lower substrate 310 and other conductive components while enabling the LLO process.

FIG. 12 is an enlarged plan view of a display device according to yet another exemplary aspect of the present disclosure. FIG. 13 is a cross-sectional view taken along line XIII-XIII' of FIG. 12. FIG. 14 is an enlarged plan view of a lower substrate of a red subpixel of FIG. 12. As compared with the display device 300 of FIGS. 9 to 11, a display device 400 of FIGS. 12 to 14 is substantially the same as the display device 300 in other configurations except that a lower substrate 410 further includes a plurality of fourth patterns PTN4, and thus, the duplicated description will be omitted.

Referring to FIGS. 12 to 14, the lower substrate 410 formed of a transparent conductive oxide or an oxide semiconductor includes a plurality of first patterns PTN1, a plurality of second patterns PTN2, a plurality of third patterns PTN3, and a plurality of fourth patterns PTN4. The plurality of first patterns PTN1 is disposed to overlap with the light shielding layer LS and in contact with the light shielding layer LS. The plurality of second patterns PTN2 may overlap with the signal line and may be in contact with the signal line. The plurality of third patterns PTN3 may overlap with the emission area EA. The plurality of first patterns PTN1 is substantially the same as the plurality of first patterns PTN1 described in FIGS. 1 to 5, the plurality of second patterns PTN2 is substantially the same as the plurality of second patterns PTN2 described in FIGS. 6 to 8, and the plurality of third patterns PTN3 is substantially the same as the plurality of third patterns PTN3 described in FIGS. 9 to 11.

The plurality of fourth patterns PTN4 overlaps with a portion of the conductive layer that does not overlap with the light shielding layer LS in the circuit area CA and in contact with the portion of the conductive layer. Here, the conductive layer is disposed in the circuit area CA, and is a region which is formed of the same material as the gate electrodes GE1, GE2, and GE3, but does not overlap with the light shielding layer LS. At this time, the portion of the conductive layer may be the auxiliary high potential power line VDDa which does not overlap with the light shielding layer LS, the plurality of gate electrodes GE1, GE2, and GE3 which does not overlap with the light shielding layer LS, the gate line GL which does not overlap with the light shielding layer LS, and the sensing line SL which does not overlap with the light shielding layer LS, but is not limited thereto. Accordingly, the plurality of fourth patterns PTN4 may be disposed to be in contact with the lower surfaces of the auxiliary high potential power line VDDa, the plurality of gate electrodes GE1, GE2, and GE3, the gate line GL, and the sensing line SL. At this time, on the plane, the shape and the size of the four patterns PTN4 may be substantially the same as the shape and the size of the portion which does not overlap with the light shielding layer LS, among the auxiliary high potential power line VDDa, the plurality of gate electrodes GE1, GE2, and GE3, the gate line GL, and the sensing line SL.

In the display device 400 according to yet another exemplary aspect of the present disclosure, the lower substrate 410 is formed of either a transparent conductive oxide or an oxide semiconductor to perform an LLO process. In particular, in the display device 400 according to yet another exemplary aspect of the present disclosure, the lower substrate 410 includes the plurality of first patterns PTN1, the plurality of second patterns PTN2, the plurality of third patterns PTN3, and the plurality of fourth patterns PTN4 to further increase the area of the lower substrate 410. Therefore, the lower substrate 410 and the temporary substrate may be easily separated from each other.

In addition, in the display device 400 according to yet another exemplary aspect of the present disclosure, the lower substrate 410 formed of the transparent conductive oxide or the oxide semiconductor instead of the plastic substrate includes the plurality of first patterns PTN1 overlapping and in contact with the light shielding layer LS and the plurality of second patterns PTN2 overlapping and in contact with the signal lines. In addition, the lower substrate 410 includes the plurality of third patterns PTN3 overlapping with the emission area EA and the plurality of fourth patterns PTN4 overlapping and in contact with the portion of the conductive layer which does not overlap with the light shielding layer LS in the circuit area CA. Particularly, the plurality of fourth patterns PTN4 overlapping with the auxiliary high potential power line VDDa, the plurality of gate electrodes GE1, GE2, and GE3, the gate line GL, and the sensing line SL which do not overlap with the light shielding layer LS is spaced apart from the auxiliary high potential power line VDDa, the plurality of gate electrodes GE1, GE2, and GE3, the gate line GL, and the sensing line SL located thereon. At this time, parasitic capacitance may be generated between the portion of the conductive layer and the plurality of fourth patterns PTN4. In this case, when parasitic capacitance is generated in the conductive layer, interference is generated in the conductive layer to affect the characteristics of the transistor TR and affect the driving of the display device 400. Accordingly, in the display device 400 according to yet another exemplary aspect of the present disclosure, the lower substrate 410 uses the plurality of first patterns PTN1 overlapping and in contact with the light shielding layer LS and the plurality of second patterns PTN2 overlapping and in contact with the signal lines. In addition, the lower substrate 410 uses the plurality of third patterns PTN3 overlapping with the emission area, and the plurality of fourth patterns PTN4 overlapping and in contact with the portion of the conductive layer which does not overlap with the light shielding layer LS. As a result, it is possible to reduce the generation of the parasitic capacitance between the lower substrate 410 and other conductive components while enabling the LLO process.

FIG. 15 is a plan view of a pad and a link line of a display device according to yet another exemplary aspect of the present disclosure. FIG. 16 is a schematic cross-sectional view of a display device according to yet another exemplary aspect of the present disclosure. As compared with various display devices 100, 200, 300, and 400 of FIGS. 1 to 14, a display device 500 of FIGS. 15 and 16 is substantially the same as the display devices 100, 200, 300, and 400 in other configurations except that a lower substrate 510 further includes a plurality of fifth patterns PTN5 and a plurality of sixth patterns PTN6, and thus, the duplicated description will be omitted.

The non-display area NA is an area surrounding the display area AA, which includes a link area and a pad area.

The link area extends from one side of the display area AA. The link area is an area in which a plurality of link lines 520 and 530 for transmitting signals to lines disposed in the display area AA is disposed, and disposed with various link lines 520 and 530. For example, a data link line, a gate link line, a high potential voltage supply link line, etc. may be disposed in the link area. In addition, the plurality of link lines 520 and 530 transmits signals from a gate driver IC, a data driver IC, etc. that may be disposed on a separate flexible film 160 to the signal lines disposed in the display area AA. That is, the plurality of link lines 520 and 530 is disposed in the link area and the pad area to connect the plurality of pads PE and the signal lines disposed in the display area AA.

The plurality of link lines 520 and 530 may be formed of a conductive material. The plurality of link lines 520 and 530 may be formed of the same material as at least one of the anode AN and the cathode CA of the light emitting device in the display area AA, and the gate electrodes GE1, GE2, and GE3, the source electrodes SE1, SE2, and SE3, and the drain electrodes DE1, DE2, and DE3 of the transistors TR1, TR2, and TR3. For example, the plurality of link lines 520 and 530 may be formed of molybdenum (Mo), chromium (Cr), titanium (Ti), nickel (Ni), neodymium (Nd), copper (Cu), an alloy of silver (Ag) and magnesium (Mg), and the like.

The plurality of link lines 520 and 530 includes a first portion 530 and a second portion 520. The first portion 530 of the plurality of link lines 520 and 530 is connected to the plurality of pads PE. The first portion 530 is a portion extending from the plurality of pads PE in a direction of the display area AA. The second portion 520 of the plurality of link lines 520 and 530 may be connected to the signal line of the display area AA. The second portion 520 is a portion that connects the first portion 530 with the signal line of the display area AA. In this case, the first portion 530 of the plurality of link lines 520 and 530 may be formed of the same material as the gate electrodes GE1, GE2, and GE3 of the transistors TR1, TR2, and TR3, and the second portion 520 of the plurality of link lines 520 and 530 may be formed of the same material as the light shielding layer LS. However, the present disclosure is not limited thereto.

The pad area is an area in which the plurality of pads PE is disposed. The pad area is an area where the plurality of pads PE and the flexible film 160 are bonded to each other. The plurality of pads PE may be formed of the same material on the same layer as the first portion 530 of the plurality of link lines 520 and 530. In particular, the plurality of pads PE may be formed integrally with the first portion 530.

Referring to FIG. 16, the lower substrate 510 formed of a transparent conductive oxide or an oxide semiconductor includes a plurality of first patterns PTN1, a plurality of second patterns PTN2, a plurality of third patterns PTN3, a plurality of fourth patterns PTN4, a plurality of fifth patterns PTN5, and a plurality of sixth patterns PTN6. The plurality of first patterns PTN1 is disposed to overlap with the light shielding layer LS and in contact with the light shielding layer LS. The plurality of second patterns PTN2 overlaps with the signal line and may be in contact with the signal line. The plurality of third patterns PTN3 may overlap with the emission area EA. The plurality of fourth patterns PTN4 may be overlapped and in contact with a portion of the conductive layer that does not overlap with the light shielding layer LS. The plurality of first patterns PTN1 is substantially the same as the plurality of first patterns PTN1 described in FIGS. 1 to 5, and the plurality of second patterns PTN2 is substantially the same as the plurality of second patterns PTN2 described in FIGS. 6 to 8. In addition, the plurality of third patterns PTN3 is substantially the same as the plurality of third patterns PTN3 described in FIGS. 9 to 11 and the plurality of fourth patterns PTN4 is substantially the same as the plurality of fourth patterns PTN4 described in FIGS. 12 to 14.

The plurality of fifth patterns PTN5 may overlap with the plurality of pads PE and may be in contact with the plurality of pads PE. Here, the plurality of pads PE is disposed in the non-display area NA and may be formed of the same material as the gate electrodes GE1, GE2, and GE3 of the transistors TR1, TR2, and TR3, but it is not limited thereto. The plurality of fifth patterns PTN5 may be disposed on the lower surface of the plurality of pads PE, and in this case, the shape and the size of the fifth pattern PTN5 on a plane are substantially the same as the shape and the size of the plurality of pads PE.

The plurality of sixth patterns PTN6 may overlap with the plurality of link lines 520 and 530 connecting the plurality of signal lines and the plurality of pads PE, and may be in contact with the plurality of link lines 520 and 530. Here, the plurality of link lines 520 and 530 is disposed in the non-display area NA, the first portion 530 of the plurality of link lines 520 and 530 may be formed of the same material as the gate electrodes GE1, GE2, and GE3 of the transistors TR1, TR2, and TR3. In addition, the second portion 520 of the plurality of link lines 520 and 530 may be formed of the same material as the light shielding layer LS, but the present disclosure is not limited thereto. The plurality of sixth patterns PTN6 may be disposed on the lower surfaces of the plurality of link lines 520 and 530, and in this case, the shape and the size of the sixth patterns PTN6 on a plane are substantially the same as the shape and the size of the plurality of link lines 520 and 530.

The flexible film 160 and the polarizing plate 150 may be disposed below the lower substrate 510. The flexible film 160 may be attached to the pad PE through an anisotropic conductive film (ACF) 190. The anisotropic conductive film 190 may electrically connect the flexible film 160 with the plurality of pads PE. The anisotropic conductive film 190 may include an adhesive resin and conductive balls dispersed in the adhesive resin. The flexible film 160 and the plurality of pads PE are electrically in contact with each other by the conductive balls of the anisotropic conductive film 190.

Referring to FIG. 16, the passivation layer 113 may be stacked to cover the upper portions of the plurality of pads PE and to protect the pads PE and the link lines 520 and 530. The link lines 520 and 530 and the passivation layer 113 disposed on the panel PE may also serve as a buffering material that cushions the impact when the display device receives an impact.

In addition, the planarization layer 114, the bank 115, and an upper substrate 180 may be disposed on the passivation layer 113 to cover the upper portions of the plurality of pads PE. According to a conventional design of the non-display area, the passivation layer 113, the planarization layer 114, the bank 115, and the upper substrate 180 formed to protect the light emitting device inside the panel are not formed on the pad PE. Here, the upper substrate 180 may be specifically a face seal metal (FSM). In the display device 500 according to yet another aspect of the present disclosure, the upper substrate 180 may extend to a region covering the upper portions of the plurality of pads PE. In addition, the passivation layer 113, the planarization layer 114, and the bank 115 may be further disposed between the upper substrate 180 and the pads PE. Although not illustrated in FIG. 16, the panel and the upper substrate 180 may be adhered and fixed to each other by an adhesive layer FSP disposed on the bank 115.

In the display device 500 according to yet another exemplary aspect of the present disclosure, the lower substrate 510 is formed of either a transparent conductive oxide or an oxide semiconductor to perform an LLO process. In particular, in the display device 500 according to yet another exemplary aspect of the present disclosure, the lower substrate 510 includes the plurality of first patterns PTN1, the plurality of second patterns PTN2, the plurality of third patterns PTN3, the plurality of fourth patterns PTN4, the plurality of fifth patterns PTN5, and the plurality of sixth patterns PTN6. Accordingly, it is possible to further increase the area of the lower substrate 510, so that the lower substrate 510 and the temporary substrate may be easily separated from each other.

In addition, in the display device 500 according to yet another exemplary aspect of the present disclosure, the lower substrate 510 formed of the transparent conductive oxide or the oxide semiconductor instead of the plastic substrate includes the plurality of first patterns PTN1 overlapping and in contact with the light shielding layer LS and the plurality of second patterns PTN2 overlapping and in contact with the signal lines. In addition, the lower substrate 510 includes the plurality of third patterns PTN3 overlapping with the emission area EA, the plurality of fourth patterns PTN4 overlapping and in contact with the portion of the conductive layer that does not overlap with the light shielding layer LS. In addition, the lower substrate 510 includes the plurality of fifth patterns PTN5 overlapping and in contact with the plurality of pads PE and the plurality of sixth patterns PTN6 overlapping and in contact with the plurality of link lines 520 and 530. The plurality of pads PE and the first portion 530 of the plurality of link lines may be formed of the same material as the gate electrode of the transistor TR, and the second portion 520 of the plurality of link lines may be formed as the same material as the light shielding layer LS. Accordingly, when the plurality of fifth patterns and the plurality of sixth patterns are spaced apart from the plurality of pads PE and the plurality of link lines 520 and 530, respectively, parasitic capacitance may be generated among the plurality of pads PE, the plurality of link lines 520 and 530, and the plurality of fifth and sixth patterns PTN5 and PTN6. In this case, when the parasitic capacitance is generated in the plurality of pads PE and the plurality of link lines 520 and 530, interference may occur in signals transmitted by the link lines 520 and 530, and may affect the driving of the display device 500. Accordingly, in the display device 500 according to yet another exemplary aspect of the present disclosure, the lower substrate 510 uses the plurality of first patterns PTN1 overlapping and in contact with the light shielding layer LS and the plurality of second patterns PTN2 overlapping and in contact with the signal lines. In addition, the lower substrate 510 uses the plurality of third patterns PTN3 overlapping with the emission area EA, and the plurality of fourth patterns PTN4 overlapping and in contact with the portion of the conductive layer which does not overlap with the light shielding layer LS. In addition, the lower substrate 510 uses the plurality of fifth patterns PTN5 overlapping and in contact with the plurality of pads PE and the plurality of sixth patterns PTN6 overlapping and in contact with the plurality of link lines 520 and 530. As a result, it is possible to reduce the generation of the parasitic capacitance between the lower substrate 510 and other conductive components while enabling the LLO process.

In addition, in the display device 500 according to yet another aspect of the present disclosure, the upper substrate 180 is disposed to cover the upper portions of the plurality of pads PE, and the passivation layer 113, the planarization layer 114, and the bank 115 are disposed between the plurality of pads PE and the upper substrate 180. Accordingly, in the display device 500 according to yet another aspect of the present disclosure, the upper substrate 180 having relatively rigidity, the passivation layer 113 capable of absorbing the impact, the planarization layer 114, and the bank 115 are disposed on the pad PE. Accordingly, the display device 500 may have a structure strong to the area in which the pad is disposed and crack defects in the area in which the pad is disposed may be improved.

FIGS. 17A to 17C are plan views of a gate driver of the display device according to yet another exemplary aspect of the present disclosure. FIG. 18 is a cross-sectional view taken along line XVIII-XVIII' of FIG. 17C. As compared with various display devices 100, 200, 300, 400, and 500 of FIGS. 1 to 16, a display device 600 of FIGS. 17A to 18 is substantially the same as the display devices in other configurations except that a lower substrate 610 further includes a plurality of seventh patterns PTN7 and a plurality of eighth patterns PTN8, and thus, the duplicated description will be omitted. FIG. 17A is a plan view of a light shielding layer 620 of the gate driver, FIG. 17B is a plan view of a gate line 630 of the gate driver, and FIG. 17C is a plan view in which the light shielding layer 620 of FIG. 17A and the gate line 630 of FIG. 17B overlap with each other.

The gate driver may be disposed in the non-display area NA. For example, the gate driver may be disposed in the non-display area NA positioned on both sides of the display area AA. The gate driver may include a plurality of gate driving transistors. In addition, the gate driver may also include various lines and capacitors, and the like as well as a plurality of gate driving transistors. The disposition of the plurality of gate driving transistors, lines, capacitors, and the like in the gate driver may vary according to a design, and is not limited to the exemplary aspect illustrated in FIGS. 17A to 17C.

The light shielding layer LS may be disposed below active layers of the plurality of gate driving transistors of the gate driver. The light shielding layer LS may be disposed to overlap with the active layer of the gate driving transistor to block light incident to the active layer. In addition, in order to drive the driving circuit of the gate driver, various lines including the gate line 630 may be disposed. A gate electrode of the gate driving transistor may be connected to the gate line 630.

Referring to FIG. 18, the lower substrate 610 formed of a transparent conductive oxide or an oxide semiconductor further includes a plurality of seventh patterns PTN7 and a plurality of eighth patterns PTN8 in the gate driver. The plurality of first patterns PTN1 is disposed to overlap with the light shielding layer LS and in contact with the light shielding layer LS. The plurality of second patterns PTN2 overlaps with the signal line and may be in contact with the signal line. The plurality of third patterns PTN3 may overlap with the emission area EA. The plurality of fourth patterns PTN4 may be overlapped and in contact with a portion of the conductive layer that does not overlap with the light shielding layer LS. The plurality of fifth patterns PTN5 may be overlapped and in contact with the plurality of pads PE, and the plurality of sixth patterns PTN6 may be overlapped and in contact with the plurality of link lines 520 and 530. The plurality of first patterns PTN1 is substantially the same as the plurality of first patterns PTN1 described in FIGS. 1 to 5, and the plurality of second patterns PTN2 is substantially the same as the plurality of second patterns PTN2 described in FIGS. 6 to 8. In addition, the plurality of third patterns PTN3 is substantially the same as the plurality of third patterns PTN3 described in FIGS. 9 to 11 and the plurality of fourth patterns PTN4 is substantially the same as the plurality of fourth patterns PTN4 described in FIGS. 12 to 14. The plurality of fifth patterns PTN5 and the plurality of sixth patterns PTN6 are substantially the same as the plurality of fifth patterns PTN5 and the plurality of sixth patterns PTN6 described with reference to FIGS. 15 and 16.

The plurality of seventh patterns PTN7 may be disposed to overlap with the light shielding layer LS disposed below the gate driving transistor in the gate driver and be in contact with the light shielding layer LS. The plurality of eighth patterns PTN8 may be disposed to overlap and in contact with a portion of the conductive layer that does not overlap with the light shielding layer LS in the gate driver. In this case, the portion of the conductive layer that does not overlap the light shielding layer LS in the gate driver may be the gate line GL, but is not limited thereto. The plurality of seventh patterns PTN7 may be disposed to be in contact with the lower surface of the light shielding layer LS of the gate driver, and the plurality of eighth patterns PTN8 may be disposed to be in contact with the lower surface of the gate line GL of the gate driver. In this case, on a plane, the shapes and the sizes of the seventh pattern PTN7 and the eighth pattern PTN8 may be substantially the same as the shapes and the sizes of the light shielding layer LS and the gate line GL of the gate driver, respectively.

In the display device 600 according to yet another exemplary aspect of the present disclosure, the lower substrate 610 is formed of either a transparent conductive oxide or an oxide semiconductor to perform an LLO process. In particular, in the display device 600 according to yet another exemplary aspect of the present disclosure, the lower substrate 610 includes the plurality of first patterns PTN1, the plurality of second patterns PTN2, the plurality of third patterns PTN3, the plurality of fourth patterns PTN4, the plurality of fifth patterns PTN5, the plurality of sixth patterns PTN6, the plurality of seventh patterns PTN7, and the plurality of eighth patterns PTN8. Accordingly, it is possible to further increase the area of the lower substrate 610, so that the lower substrate 610 and the temporary substrate may be easily separated from each other.

In addition, in the display device 600 according to yet another exemplary aspect of the present disclosure, the lower substrate 610 formed of a transparent conductive oxide or an oxide semiconductor instead of a plastic substrate may include the plurality of seventh patterns PTN7 overlapping and in contact with the light shielding layer LS in the gate driver in addition to the plurality of first to sixth patterns PTN1, PTN2, PTN3, PTN4, PTN5, and PTN6. In addition, the lower substrate 610 may include the plurality of eighth patterns PTN8 overlapping and in contact with the portion of the conductive layer that does not overlap with the light shielding layer LS in the gate driver. In particular, when the plurality of seventh patterns PTN7 overlapping with the light shielding layer LS in the gate driver is spaced apart from the light shielding layer LS positioned thereon, parasitic capacitance may be generated between the light shielding layer LS and the plurality of seventh patterns PTN7. When the plurality of eighth patterns PTN8 overlapping with the portion of the conductive layer that does not overlap with the light shielding layer LS in the gate driver is spaced apart from the portion of the conductive layer located thereon, parasitic capacitance may be generated even between the portion of the conductive layer and the plurality of eighth patterns PTN8. In this case, when the parasitic capacitance is generated in the light shielding layer LS or the conductive layer, an interference phenomenon may occur to affect the driving of the gate driver. Accordingly, in the display device 600 according to yet another exemplary aspect of the present disclosure, the lower substrate 610 uses the plurality of seventh patterns PTN7 overlapping and in contact with the light shielding layer LS, the plurality of eighth patterns PTN8 overlapping and in contact with the portion of the conductive layer that does not overlap with the light shielding layer LS. As a result, it is possible to reduce the generation of the parasitic capacitance between the lower substrate 610 and other conductive components while enabling the LLO process.

The exemplary aspects of the present disclosure can also be described as follows:

According to an aspect of the present disclosure, a display device including a display area including a plurality of subpixels and a non-display area, the display device comprises a lower substrate formed of a transparent conductive oxide or an oxide semiconductor; a plurality of transistors and a plurality of light emitting devices disposed in the plurality of subpixels on the lower substrate; and a metal layer disposed between the lower substrate and the plurality of transistors, wherein the lower substrate includes a plurality of first patterns overlapping with the metal layer and in contact with the metal layer.

The metal layer may be disposed to overlap with active layers of the plurality of transistors.

The metal layer may further include a signal line disposed in the display area and disposed on the same layer as the metal layer, and the lower substrate may further include a plurality of second patterns overlapping with the signal line and in contact with the signal line.

Each of the plurality of subpixels may include an emission area and a circuit area, and the lower substrate may further include a plurality of third patterns overlapping with the emission area.

The lower substrate may further include a plurality of fourth patterns that overlaps with a portion of a conductive layer that does not overlap with the metal layer in the circuit area and is in contact with the portion of the conductive layer.

The display device may further comprise a plurality of pads disposed in the non-display area, wherein the lower substrate may further include a plurality of fifth patterns overlapping with the plurality of pads and in contact with the plurality of pads.

The display device may further comprise an upper substrate disposed on the plurality of light emitting devices; and a plurality of flexible films electrically connected to the plurality of pads, wherein the upper substrate may be disposed to cover upper portions of the plurality of pads, and the plurality of flexible films may be disposed on an opposite side of the upper substrate with respect to the lower substrate and electrically connected to the plurality of pads through the plurality of fifth patterns.

The display device may further comprise one or more insulating layers disposed on the plurality of transistors, wherein the one or more insulating layers may be disposed between the plurality of pads and the upper substrate.

The display device may further comprise a plurality of signal lines disposed in the display area; and a plurality of link lines disposed in the non-display area and connecting the plurality of signal lines with the plurality of pads, wherein the lower substrate may further include a plurality of sixth patterns overlapping with the plurality of link lines and in contact with the plurality of link lines.

The display device may further comprise a gate driver disposed in the non-display area and including a plurality of gate driving transistors, wherein the metal layer may be disposed under the plurality of gate driving transistors, and the lower substrate may further include a plurality of seventh patterns overlapping with the metal layer and in contact with the metal layer.

The lower substrate may further include a plurality of eighth patterns that overlaps with a portion of a conductive layer that does not overlap with the metal layer in the gate driver and is in contact with the portion of the conductive layer.

According to another aspect of the present disclosure, a display device comprise a pixel unit disposed in a display area and including a plurality of transistors and a plurality of light emitting devices; a light shielding layer disposed to overlap with active layers of the plurality of transistors; and a functional thin film layer disposed under the light shielding layer and formed of a transparent conductive oxide or an oxide semiconductor, wherein the functional thin film layer includes a plurality of first patterns which has a shape corresponding to the light shielding layer and is in contact with a lower surface of the light shielding layer.

The display device may further comprise a signal line disposed in the display area and made of the same material as the light shielding layer, wherein the functional thin film layer may further include a plurality of second patterns that has a shape corresponding to the signal line and is in contact with a lower surface of the signal line.

The pixel unit may include an emission area and a circuit area, and the functional thin film layer may further include a plurality of third patterns disposed at a position corresponding to the emission area.

The functional thin film layer may further include a plurality of fourth patterns that has a shape corresponding to a portion of a conductive layer disposed in an area other than an area where the light shielding layer is disposed in the circuit area and is in contact with a lower surface of the portion of the conductive layer.

The display may further comprise a plurality of pads disposed in the non-display area, wherein the functional thin film layer further may include a plurality of fifth patterns that has a shape corresponding to the plurality of pads and is in contact with lower surfaces of the plurality of pads.

The display device may further comprise a metal substrate disposed on the plurality of light emitting devices and disposed to overlap with the plurality of pads; and a plurality of flexible films electrically connected to the plurality of pads, wherein the plurality of flexible films may be electrically connected to the plurality of pads through the plurality of fifth patterns.

The display device may further comprise a plurality of signal lines disposed in the display area; and a plurality of link lines disposed in the non-display area and connecting the plurality of signal lines with the plurality of pads, wherein the functional thin film layer may further include a plurality of sixth patterns that has the same shape as the plurality of link lines and is in contact with lower surfaces of the plurality of link lines.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device including a display area having a plurality of subpixels and a non-display area, the display device comprising:
a lower substrate formed of a transparent conductive oxide or an oxide semiconductor;
a plurality of transistors and a plurality of light emitting devices disposed in the plurality of subpixels on the lower substrate; and
a metal layer disposed between the lower substrate and the plurality of transistors,
wherein the lower substrate includes a plurality of first patterns overlapping with the metal layer and in contact with the metal layer,
wherein the metal layer is disposed under a plurality of gate driving transistors in the non-display area, and
wherein the lower substrate further includes a plurality of seventh patterns overlapping with the metal layer and in contact with the metal layer under the plurality of gate driving transistors.

2. The display device of claim 1, wherein the metal layer overlaps with active layers of the plurality of transistors.

3. The display device of claim 2, wherein the metal layer further includes a signal line disposed in the display area and disposed on a same layer as the metal layer.

4. The display device of claim 3, wherein the lower substrate further includes a plurality of second patterns overlapping with the signal line and in contact with the signal line.

5. The display device of claim 1, wherein each of the plurality of subpixels includes an emission area and a circuit area.

6. The display device of claim 5, wherein the lower substrate further includes a plurality of third patterns overlapping with the emission area.

7. The display device of claim 6, wherein the lower substrate further includes a plurality of fourth patterns that overlaps with a portion of a conductive layer that does not overlap with the metal layer in the circuit area and is in contact with the portion of the conductive layer.

8. The display device of claim 7, further comprising:
a plurality of pads disposed in the non-display area,
wherein the lower substrate further includes a plurality of fifth patterns overlapping with the plurality of pads and in contact with the plurality of pads.

9. The display device of claim 8, further comprising:
an upper substrate disposed on the plurality of light emitting devices; and
a plurality of flexible films electrically connected to the plurality of pads,
wherein the upper substrate is disposed to cover upper portions of the plurality of pads, and
wherein the plurality of flexible films is disposed on an opposite side of the upper substrate with respect to the lower substrate and electrically connected to the plurality of pads through the plurality of fifth patterns.

10. The display device of claim 9, further comprising one or more insulating layers disposed on the plurality of transistors,
wherein the one or more insulating layers are disposed between the plurality of pads and the upper substrate.

11. The display device of claim 8, further comprising:
a plurality of signal lines disposed in the display area; and a plurality of link lines disposed in the non-display area and connecting the plurality of signal lines with the plurality of pads,
wherein the lower substrate further includes a plurality of sixth patterns overlapping with the plurality of link lines and in contact with the plurality of link lines.

12. The display device of claim 1, wherein the lower substrate further includes a plurality of eighth patterns that overlaps with a portion of a conductive layer that does not overlap with the metal layer in the gate driver and is in contact with the portion of the conductive layer.

13. A display device comprising:
a pixel unit disposed in a display area and including a plurality of transistors and a plurality of light emitting devices;
a light shielding layer overlapping with active layers of the plurality of transistors; and
a functional thin film layer disposed under the light shielding layer and formed of a transparent conductive oxide or an oxide semiconductor,
wherein the functional thin film layer includes a plurality of first patterns which has a shape corresponding to the light shielding layer and is in contact with a lower surface of the light shielding layer,
wherein the pixel unit includes an emission area and a circuit area, and
wherein the functional thin film layer further includes a plurality of third patterns disposed at a position corresponding to the emission area,
wherein the functional thin film layer further includes a plurality of fourth patterns that has a shape corresponding to a portion of a conductive layer disposed in an area other than an area where the light shielding layer is disposed in the circuit area, wherein the plurality of fourth patterns is in contact with a lower surface of the portion of the conductive layer, and
wherein the functional thin film layer further includes a plurality of fifth patterns that has a shape corresponding to a plurality of pads in a non-display area of the display device, wherein the plurality of fifth patterns is in contact with lower surfaces of the plurality of pads.

14. The display device of claim 13, further comprising a signal line disposed in the display area and made of the same material as the light shielding layer,
wherein the functional thin film layer further includes a plurality of second patterns that has a shape corresponding to the signal line and is in contact with a lower surface of the signal line.

15. The display device of claim 13, further comprising:
a metal substrate disposed on the plurality of light emitting devices and overlapping with the plurality of pads; and
a plurality of flexible films electrically connected to the plurality of pads,
wherein the plurality of flexible films is electrically connected to the plurality of pads through the plurality of fifth patterns.

16. The display device of claim 13, further comprising:
a plurality of signal lines disposed in the display area; and
a plurality of link lines disposed in the non-display area and connecting the plurality of signal lines with the plurality of pads,
wherein the functional thin film layer further includes a plurality of sixth patterns that has the same shape as the plurality of link lines and is in contact with lower surfaces of the plurality of link lines.

\* \* \* \* \*